US 6,669,774 B1

(12) United States Patent
Zhang et al.

(10) Patent No.: US 6,669,774 B1
(45) Date of Patent: Dec. 30, 2003

(54) METHODS AND COMPOSITIONS FOR MAKING A MULTI-LAYER ARTICLE

(75) Inventors: Wei Zhang, Shrewsbury, MA (US); Edward J. Siegal, Malden, MA (US); Martin W. Rupich, Framingham, MA (US); Qi Li, Marlborough, MA (US)

(73) Assignee: American Superconductor Corporation, Westborough, MA (US)

( * ) Notice: Subject to any disclaimer, the term of this patent is extended or adjusted under 35 U.S.C. 154(b) by 0 days.

(21) Appl. No.: 09/615,991

(22) Filed: Jul. 14, 2000

Related U.S. Application Data

(60) Provisional application No. 60/166,145, filed on Nov. 18, 1999, provisional application No. 60/166,297, filed on Nov. 18, 1999, and provisional application No. 60/166,240, filed on Nov. 18, 1999.

(51) Int. Cl.[7] ............................. C30B 5/00; H01L 39/24
(52) U.S. Cl. ........................................... 117/4; 505/446
(58) Field of Search ..................... 505/440, 441, 505/445, 446; 117/12, 923, 4

(56) References Cited

U.S. PATENT DOCUMENTS

| | | |
|---|---|---|
| 3,763,552 A | 10/1973 | Brown et al. |
| 3,985,281 A | 10/1976 | Diepers et al. |
| 4,442,396 A | 4/1984 | Hucker |
| 4,659,973 A | 4/1987 | Stich |
| 4,859,652 A | 8/1989 | Block |
| 4,882,312 A | 11/1989 | Mogro-Campero et al. |
| 4,956,340 A | 9/1990 | Kimura et al. |
| 4,959,347 A | 9/1990 | Kobayashi et al. |
| 4,994,433 A | 2/1991 | Chiang |
| 4,994,435 A | 2/1991 | Shiga et al. |
| 5,038,127 A | 8/1991 | Dersch |
| 5,071,828 A | 12/1991 | Greuter et al. |
| 5,073,537 A | 12/1991 | Hung et al. |
| 5,229,358 A | 7/1993 | Kumar |
| 5,231,074 A | 7/1993 | Cima et al. |
| 5,236,890 A | 8/1993 | Murakami et al. |
| 5,304,533 A | 4/1994 | Kobayashi et al. |

(List continued on next page.)

FOREIGN PATENT DOCUMENTS

| | | |
|---|---|---|
| EP | 0 387 525 | 9/1990 |
| EP | 0 431 782 | 6/1991 |
| EP | 0 506 582 A2 | 9/1992 |
| EP | 0 584 410 | 3/1994 |
| EP | 0308869 | 9/1998 |
| EP | 0 872 579 | 10/1998 |
| JP | 57075564 | 5/1982 |
| JP | 63310366 | 12/1988 |
| WO | WO 91/16149 | 10/1991 |
| WO | WO92/05591 | 4/1992 |
| WO | WO 98/58415 | 12/1993 |
| WO | WO 97/05669 | 2/1997 |
| WO | WO 99/16941 | 4/1999 |
| WO | WO 99/17307 | 4/1999 |
| WO | WO 99/25908 | 5/1999 |
| WO | WO 99/35083 | 7/1999 |
| WO | WO 01/98076 | 12/2001 |

OTHER PUBLICATIONS

Apicella, M.L. et al., "The Effects of Surface Contamination on the Biaxially Textured Substrate for YBCO Thick Film Deposition", *International Journal of Modern Physics B*, vol. 13, Nos. 9&10 (1999) 997–1004.

Boffa V. et al., "Laser–ablation deposition of $CeO_2$ thin films on biaxially textured nickel substrates", *Physica C*, vol. 312, (1999), pp. 202–212.

(List continued on next page.)

*Primary Examiner*—Benjamin L. Utech
*Assistant Examiner*—Matthew Anderson
(74) *Attorney, Agent, or Firm*—Fish & Richardson P.C.

(57) ABSTRACT

The invention relates to methods and compositions for making a multi-layer article. The compositions can be used in relatively fast methods which can superconductor material intermediates that have relatively few cracks and/or blisters. The compositions can have relatively low water contents.

86 Claims, 4 Drawing Sheets

U.S. PATENT DOCUMENTS

| | | | |
|---|---|---|---|
| 5,427,055 A | | 6/1995 | Ichikawa |
| 5,449,659 A | | 9/1995 | Garrison et al. |
| 5,484,766 A | | 1/1996 | Shah et al. |
| 5,571,603 A | | 11/1996 | Utumi et al. |
| 5,728,214 A | | 3/1998 | Konishi et al. |
| 5,741,377 A | | 4/1998 | Goyal et al. |
| 5,866,252 A | | 2/1999 | de Rochemont et al. |
| 5,958,599 A | | 9/1999 | Goyal et al. |
| 5,964,966 A | | 10/1999 | Goyal et al. |
| 5,968,877 A | | 10/1999 | Budai et al. |
| 5,981,445 A | | 11/1999 | Kirchnerova et al. |
| 6,022,832 A | * | 2/2000 | Fritzemeier et al. ........ 505/461 |
| 6,027,564 A | | 2/2000 | Fritzemeier et al. |
| 6,077,344 A | | 6/2000 | Shoup et al. |
| 6,172,009 B1 | * | 1/2001 | Smith et al. ................. 505/473 |
| 6,256,521 B1 | * | 7/2001 | Lee et al. .................... 505/273 |

OTHER PUBLICATIONS

IBM Technical Disclosure Bulletin, "Fabrication of High Temperature Superconducting Films Using Perfluoro–Organometallic Precursors", vol. 32, No. 5B, Oct. 1989, p. 241.

McIntyre, Paul C. et al., "Effect of growth conditions on the properties and morphology of chemically derived epitaxial thin films of $Ba_2Ycu_3O_{7-x}$ on (001) $LaAlO_3$", *J. Appl. Phys.*, vol. 71, No. 4, Feb. 15, 1992, pp. 1868–1877.

Qing He, D.K. et al., "Deposition of biaxially–oriented metal and oxide buffer–layer films on textured Ni tapes: new substrates for high–current, high–temperature superconductors", *Physica C*, vol. 275 (1997) pp. 155–161.

Sheth, Atul et al., "Bench Scale Evaluation of Batch Mode Dip–Coating of Sol–Gel $LaAlO_3$ Buffer Material", *IEEE Transactions on Applied Superconductivity*, vol. 9, No. 2, Jun. 1999, pp. 1514–1518.

Araki et al., "Coating processes for $Yba_2Cu_3O_{7-x}$ superconductor by metalorganic deposition method using trifluoroacetates", *Supercond. Sci. Technol.* 14(2001) 783–786.

Araki et al. "Fabrication of $Yba_2Cu_3O_{7-x}$ Films on Buffered Metal Tapes Fired at Low Temperature by MOD Method using Trifluoroacetate Salts", *IEEE Transactions on Applied Superconductivity*, vol. 11, No. 1, Mar. 2001.

Araki et al., "The effects of process conditions on $Yba_2Cu_3O_{7-x}$ films by metalorganic depositions method using trifluoracetates", Division V, Superconductivity Research Laboratory, ISTEC, 2–4–1, Mutsuno, Atsuta–ku, Nagoya, 456–8587, Japan.

Gupta, et al., "Superconducting oxide films with high transition temperature prepared from metal trifluoroacetate precursors," 320 Applied Physics Letters 52 (1988) No. 24, New York, NY, USA.

Koster et al., "flInfluence of the Surface Treatment on the Homoepitaxial Growth of $SrTiO_3$," *Materials Science & Engineering B56* (1998) p. 209–212.

Manabe et al. "Preparation of Y123 films by coating pyrolysis using a novel fluorine–contained complex solution" Institute for Materials and Chemical Process, National Institute of Advanced Industrial Science and Technology (AIST), Umezono 1–1–1, Tsukuba, Ibaraki 305–8568, Japan. Energy Electronics Institute, National Institute of Advanced Industrial Science and Technology (AIST), Umezono 1–1–1, Tsukuba, Ibaraki 305–8568, Japan.

Smith et al., "High Critical Current Density Thick MOD–Derived YBCO Films" *IEEE Transactions on Applied Superconductivity*, vol. 9, No. 2, Jun. 1999.

Yamagiwa et al "Epitaxial growth of $REBa_2Cu_3O_{7-y}$ films on various substrates by chemical solution deposition" *Journal of Crystal Growth* 229 (2001) 353–357.

G. Moore et al., "Sol–Gel Processing of $Y_1Ba_2Cu_3O_{7-x}$ Using Alkoxide Precursors: Two Systems Yielding High Degrees of Thin Film Orientation and Crystal Growth", *Materials Letters*, vol. 7, No. 12, Mar. 1989, pp. 415–424.

M.W. Rupich et al., "Synthesis of Superconductors from Soluble Metal Oxo Alkoxide Precursors", *J. Mater. Res.*, vol. 8, No. 7, Jul. 1993, pp. 1487–1496.

Smith, J.A. et al., "High Critical Current Density Thick MOD–Derived YBCO Films," Transactions on Applied Superconductivity, vol. 9, No. 2, Jun. 1999.

PCT International Search Report (mailed Oct. 27, 2000).

Beach et al., "Sol–Gel Synthesis of Rare Earth Aluminate Films as Buffer Layers for High Tc Superconducting Films," Mat. Res. Soc. Symp. Proc., vol. 495, 263 (1997).

Lee et al., "Alternative Buffer Architectures for High Critical Current Density YBCO Superconducting Deposits on Rolling Assisted Biaxially–Textured Substrates," Japanese J. Appl. Phys., vol. 38, L178 (1999).

Paranthaman et al., "Growth of Biaxially Textured $RE_2O_3$ Buffer Layers on Rolled–Ni Substrates Using Reactive Evaporation for HTS–Coated Conductors," Superconductor Sci. Tech., vol. 12, 319 (1999).

Rupich et al., "Growth and Characterization of Oxide Buffer Layers for YBCO Coated Conductors," IEEE Trans. on Appl. Superconductivity, vol. 9 (1999).

Shoup et al., "Epitaxial Thin Film Growth of Lanthanum and Neodymium Aluminate Films on Roll–Textured Nickel Using a Sol–Gel Method," J. Am. Cer. Soc., vol. 81, 3019 (1998).

"Silicon Processing for the VLSI Era," vol. 1, eds. S. Wolf and R.N. Tanber, Lattice Press, Sunset Park, CA, pp. 539–574 (1986).

He et al., "Growth of Biaxially Oriented Conductive $LaNiO_3$ Buffer Layers on Textured Ni Tapes for High–$T_c$–Coated Conductors," *Physica C 314* (1999) p. 105–111.*

Tanaka et al., "Improvement of $Yba_2Cu_3O_x$ Single–Crystal Surface by Chemical Etching," *Jpn. J. Appl. Phys. vol. 38* (1999) p. L731–L733.*

Boffa, et al., "Laser–ablation deposition of $CeO_2$ thin films on biaxially textured nickel substrates", see front matter copyright 1999, Published by Elsevier Science B.V. All rights reserved.

Gupta, et al., "Superconducting oxide films with hide transition temperature prepared from metal trifluoroacetate precursors", 320 Applied Physics Letters 52 (1988) No. 24, New York, NY, USA.

McIntyre, et al., "Epitaxial nucleation and growth of chemically derived Ba2Ycu3O7–x thin films on (001) SrTiO3", 931 Journal of Applied Physics, 77 (1995), No. 10, Woodbury, NY, US.

* cited by examiner

METHODS AND COMPOSITIONS FOR MAKING A MULTI-LAYER ARTICLE

CROSS-REFERENCE TO RELATED APPLICATIONS

The present application claims priority under 35 U.S.C. §119(e)(1) to commonly owned U.S. Provisional Patent Application Serial No. 60/166,145, filed Nov. 18, 1999, and entitled "Methods and Compositions for Making a Multi-Layer Article," which is hereby incorporated by reference. This application claim benefit to Provisional Application No. 60/166,145 Nov. 18, 1999 and claim benefit of 60/166,297 filed Nov. 18, 1999 and claim benefit of 60/166,240 filed Nov. 18, 1999.

BACKGROUND OF THE INVENTION

The invention relates to methods and compositions for making a multi-layer article.

Multi-layer articles can be used in a variety of applications. For example, superconductors, including oxide superconductors, can be formed of multi-layer articles. Typically, such superconductors include a layer of superconductor material and a layer, commonly referred to as a substrate, that can enhance the mechanical strength of the multilayer article.

Generally, in addition to enhancing the strength of the multi-layer superconductor, the substrate should exhibit certain other properties. For example, the substrate should have a low Curie temperature so that the substrate is not ferromagnetic at the superconductor's application temperature. Furthermore, chemical species within the substrate should not be able to diffuse into the layer of superconductor material, and the coefficient of thermal expansion of the substrate should be about the same as the superconductor material. Moreover, if the substrate is used for an oxide superconductor, the substrate material should be relatively resistant to oxidation.

For some materials, such as yttrium-barium-copper-oxide (YBCO), the ability of the material to provide high transport current in its superconducting state depends upon the crystallographic orientation of the material. For example, such a material can exhibit a relatively high critical current density (Jc) when the surface of the material is biaxially textured.

As used herein, "biaxially textured" refers to a surface for which the crystal grains are in close alignment with a direction in the plane of the surface. One type of biaxially textured surface is a cube textured surface, in which the crystal grains are also in close alignment with a direction perpendicular to the surface. Examples of cube textured surfaces include the (100)[001] and (100)[011] surfaces, and an example of a biaxially textured surface is the (113)[211] surface.

For certain multi-layer superconductors, the layer of superconductor material is an epitaxial layer. As used herein, "epitaxial layer" refers to a layer of material whose crystallographic orientation is directly related to the crystallographic orientation of the surface of a layer of material onto which the epitaxial layer is deposited. For example, for a multi-layer superconductor having an epitaxial layer of superconductor material deposited onto a substrate, the crystallographic orientation of the layer of superconductor material is directly related to the crystallographic orientation of the substrate. Thus, in addition to the above-discussed properties of a substrate, it can be also desirable for a substrate to have a biaxially textured surface or a cube textured surface.

Some substrates do not readily exhibit all the above-noted features, so one or more intermediate layers, commonly referred to as buffer layers, can be disposed between the substrate and the superconductor layer. The buffer layer(s) can be more resistant to oxidation than the substrate, and reduce the diffusion of chemical species between the substrate and the superconductor layer. Moreover, the buffer layer(s) can have a coefficient of thermal expansion that is well matched with the superconductor material.

Typically, a buffer layer is an epitaxial layer, so its crystallographic orientation is directly related to the crystallographic orientation of the surface onto which the buffer layer is deposited. For example, in a multi-layer superconductor having a substrate, an epitaxial buffer layer and an epitaxial layer of superconductor material, the crystallographic orientation of the surface of the buffer layer is directly related to the crystallographic orientation of the surface of the substrate, and the crystallographic orientation of the layer of superconductor material is directly related to the crystallographic orientation of the surface of the buffer layer. Therefore, the superconducting properties exhibited by a multi-layer superconductor having a buffer layer can depend upon the crystallographic orientation of the buffer layer surface.

SUMMARY OF THE INVENTION

The invention relates to methods and compositions (e.g., precursor solutions) for making a multi-layer article, such as a multi-layer superconductor. In part, the methods are based upon the recognition that the physical characteristics of a superconductor material (e.g., an oxide superconductor material) formed using a precursor solution containing a trifluoroacetate salt of one or more metals can depend upon the total water content (e.g., liquid water in the solution and water vapor in the surrounding environment) present when treating the precursor solution to form an intermediate of the superconductor material. Thus, by properly balancing the total water content, as well as certain other conditions (e.g., temperature, temperature ramp rate and oxygen pressure), a good quality superconductor material layer can be prepared. In certain embodiments, the superconductor material can be prepared in a relatively short period of time. The methods can involve the use of a precursor solution having a relatively low water content and/or a relatively high solids content. The methods can also involve treating the precursor solution in an environment having a relatively high vapor pressure of water.

In one aspect, the invention features a method which includes disposing a solution on the surface of a first layer. The solution contains a salt of a first metal, a salt of a second metal and a salt of a rare earth metal. At least one of the metal salts is a trifluoroacetate salt. The method also includes treating the solution for less than about five hours to form a layer of an intermediate of a rare earth metal-second metal-first metal-oxide. The layer of the intermediate has a surface adjacent the surface of the first layer. Defects contained within the layer of the intermediate make up less than about 20 percent of any volume element of the layer of the intermediate defined by the projection of one square centimeter of the surface of the layer of the intermediate, and the layer of the intermediate is free of any defect having a maximum dimension of greater than about 200 microns.

As used herein, a "defect" refers to a crack or a blister, such as a crack or blister that is detectable by visual (or optical) inspection.

A volume element of a layer of material defined by the projection of a given area of a surface of the layer of material corresponds to the volume of the layer of material whose edges are perpendicular to the given area of the surface of the layer of material.

The intermediate can be, for example, partially or completely formed of one or more metal oxyfluoride compounds.

In another aspect, the invention features a method which includes disposing a solution on the surface of a first layer. The solution includes water, a first salt of a first metal, a second salt of a second metal and a third salt of a rare earth metal. At least one of the first, second and third salts being a trifluoroacetate, and the solution has a water content of less than about 50 volume percent. The method also includes treating the solution to form an intermediate of a rare earth metal-second metal-first metal-oxide.

In a further aspect, the invention features a method which includes disposing a solution on the surface of a first layer. The solution contains a salt of a first metal, a salt of a second metal and a salt of a rare earth metal. At least one of the metal salts is a trifluoroacetate salt. The method also includes treating the solution for less than about five hours to form an intermediate of a rare earth metal-second metal-first metal-oxide. The intermediate is capable of undergoing further processing to provide a superconductor material having a critical current density of at least about $5 \times 10^5$ Amperes per square centimeter (e.g., at least about $1 \times 10^6$ Amperes per square centimeter, at least about $1.5 \times 10^6$ Amperes per square centimeter, or at least about $2 \times 10^5$ Amperes per square centimeter).

The first metal can be copper, and the second metal can be barium, strontium or calcium. The rare earth metal can be yttrium. For example, the rare earth metal-first metal second metal-oxide can be a yttrium-barium-copper-oxide, such as $YBa_2Cu_3O_{7-x}$.

Treating the solution can include heating the solution from an initial temperature (e.g., room temperature) to a temperature of from about 190° C. to about 215° C. (e.g., about 210° C.) at a rate of about at least about 5° C. per minute then heating to a temperature of from about 220° C. to about 290° C. (e.g., about 220° C.) at a rate of from about 0.05° C. per minute to about 0.4° C. followed by heating to about 400° C. at a rate of at least about 2° C. per minute to form an intermediate. The heating steps can be performed in a nominal gas environment having a water vapor pressure of about from about 5 Torr to about 50 Torr. The nominal gas environment can have an oxygen pressure of from about 0.001 Torr to about 760 Torr.

The intermediate can be further heated to form the rare earth metal-second metal-first metal-oxide, which can have a relatively high critical current density (e.g., at least about $1 \times 10^6$ Amperes per square centimeter). The rare earth metal-second metal-first metal-oxide layer can be biaxially textured.

The first layer can be a substrate, a buffer layer, or a superconductor layer, and the surface of the first layer can be biaxially textured.

One potential advantage of the invention is that it can provide methods and compositions for forming high quality superconductor layers or layers of superconductor intermediate (e.g., metal oxyfluoride intermediate) in a relatively short period of time. For example, the methods and compositions can be used to prepare a superconductor intermediate in less than about five hours (e.g., less than about three hours or less than about one hour). The resulting superconductor layer can have a relatively low defect density and/or a relatively high critical current density.

Another potential advantage of the invention is that it can provide trifluoroacetate-containing compositions having a low water content. Treating these compositions to form a superconductor layer, or an intermediate of a superconductor layer, can take a relatively short period of time. The superconductor layers or superconductor intermediate layers prepared using these compositions can be of high quality.

The methods and compositions of the invention can be particularly advantageous when used to prepare a superconductor (e.g., an oxide superconductor), or an intermediate of such a superconductor, in the form of an object having a relatively large surface area, such as a wafer or a tape.

In certain embodiments, the methods and compositions of the invention can be particularly advantageous when used to prepare relatively thin oxide superconductor layers (e.g., layers having a thickness of less than about 0.5 micron, such as less than about 0.4 micron or less than about 0.3 micron).

In some embodiments, the superconductor material is preferably formed of YBCO (e.g., $YBa_2Cu_3O_{7-x}$).

Unless otherwise defined, all technical and scientific terms used herein have the same meaning as commonly understood by one of ordinary skill in the art to which this invention belongs. Although methods and materials similar or equivalent to those described herein can be used in the practice of the invention, suitable methods and materials are described below. In case of conflict, the present specification, including definitions, will control. In addition, the materials, methods, and examples are illustrative only and not intended to be limiting.

Other features and advantages of the invention will be apparent from the description. of the preferred embodiments, the figures and the claims.

DESCRIPTION OF THE PREFERRED EMBODIMENTS

Figure 1:
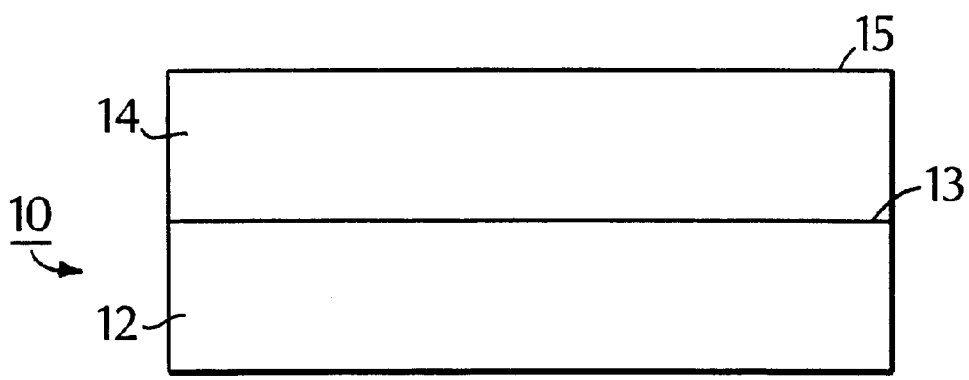
FIG. 1 is a cross-sectional view of one embodiment of a multi-layer article.

The invention relates to methods and compositions for making multi-layer articles, such as multi-layer superconductors.

The compositions include a solvent, a salt of a first metal, a salt of a second metal and a salt of a rare earth metal. Optionally, the compositions can include water. At least one of the metal salts is a trifluoroacetate. The other metal salts can be, for example, acetates, hydroxides, nitrates, alkoxides, iodides and sulfates. In some embodiments, two of the metal salts are trifluoroacetates, and in other embodiments each of the metal salts is a trifluoroacetate.

In certain embodiments, the water content of the compositions are relatively low. Preferably, the water content is less than about 50 volume percent, more preferably less than about 35 volume percent, and most preferably less than about 25 volume percent.

The first metal can be copper, and the copper salt can be copper trifluoroacetate (e.g., copper(II) trifluoroacetate).

The second metal can be barium, calcium or strontium, and the salt of the second metal can be, for example, barium trifluoroacetate.

The rare earth metal can be yttrium, lanthanum, europium, gadolinium, terbium, dysprosium, holmium, erbium, thulium, ytterbium, cerium, praseodymium, neodymium, promethium, samarium or lutetium. The salt of the rare earth metal can be, for example, yttrium trifluoroacetate.

Typically, the amount of the metal salts is selected so that the ratio of the moles of the first metal (e.g., ions of the first metal), the second metal (e.g., ions of the second metal) and the rare earth metal (e.g., ions of the rare earth metal) contained in the compositions is about 3:2:1.

In some embodiments, the total amount of trifluoroacetate contained in the composition is selected so that the ratio of the amount of fluorine supplied by the total amount of trifluoroacetate contained in the composition to the amount of the second metal contained in the composition (e.g., ions of barium) is at least about 2:1 (e.g., from about 2:1 to about 18.5:1, or from about 2:1 to about 10:1).

The solvent or combination of solvents used in the compositions can include any solvent or combination of solvents capable of dissolving the metal salts (e.g., metal trifluoroacetate(s)). Such solvents include, for example, alcohols, including methanol, ethanol, isopropanol and butanol.

In certain embodiments, the precursor composition has a relatively small amount of free acid. In aqueous solutions, this can correspond to a precursor composition with a relatively neutral pH (e.g., neither strongly acidic nor strongly basic). The precursor composition can be used to prepare multi-layer superconductors using a wide variety of materials which can be used as the underlying layer on which the superconductor layer is formed.

The total free acid concentration of the precursor composition can be less than about $1 \times 10^{-3}$ molar (e.g., less than about $1 \times 10^{-5}$ molar or about $1 \times 10^{-7}$ molar). Examples of free acids that can be contained in a precursor composition include trifluoroacetic acid, acetic acid, nitric acid, sulfuric acid, acids of iodides, acids of bromides and acids of sulfates.

When the precursor composition contains water, the precursor composition can have a pH of at least about 3 (e.g., at least about 5 or about 7).

In some embodiments, the precursor composition can have a relatively low water content (e.g., less than about 50 volume percent water, less than about 35 volume percent water, less than about 25 volume percent water).

In embodiments in which the precursor composition contains trifluoroacetic acid and an alkaline earth metal (e.g., barium), the total amount of trifluoroacetic acid can be selected so that the mole ratio of fluorine contained in the precursor composition (e.g., in the form of trifluoroacetate) to the alkaline earth metal (e.g., barium ions) contained in the precursor composition is at least about 2:1 (e.g., from about 2:1 to about 18.5:1, or from about 2:1 to about 10:1).

In general, in these embodiments, the precursor compositions can be prepared by combining soluble compounds of a first metal (e.g., copper), a second metal (e.g., an alkaline earth metal), and a rare earth metal with one or more desired solvents and optionally water. As used herein, "soluble compounds" of the first, second and rare earth metals refer to compounds of these metals that are capable of dissolving in the solvent(s) contained in the precursor compositions. Such compounds include, for example, salts (e.g., nitrates, acetates, alkoxides, iodides, sulfates and trifluoroacetates), oxides and hydroxides of these metals.

These methods and compositions are described in commonly owned U.S. Provisional Patent Application Serial No. 60/166,297, filed on Nov. 18, 1999, and entitled "Superconductor Articles and Compositions and Methods for Making Same," and commonly owned U.S. patent application Ser. No. 09/615,999, filed on even date herewith, pending and entitled "Superconductor Articles and Compositions and Methods for Making Same," both of which are hereby incorporated by reference.

In alternate embodiments, a precursor solution is formed of an organic solution containing metal trifluoroacetates prepared from powders of $BaCO_3$, $YCO_3 \cdot 3H_2O$ and $Cu(OH)_2CO_3$ combined and reacted using methods known to those skilled in the art. For example, the powders can be combined in a 2:1:3 ratio with between 20–30% (5.5–6.0 M) excess trifluoroacetic acid in methyl alcohol and then refluxed (e.g., for approximately four to ten hours) to produce a solution substantially 0.94 M based on copper content.

These methods are described in U.S. Pat. No. 5,231,074, issued on Jul. 27, 1993, and entitled "Preparation of Highly Textured Oxide Superconducting Films from MOD Precursor Solutions," which is hereby incorporated by reference.

The methods of the invention can be used to prepare the superconductor intermediate (e.g., metal oxyfluoride) from the initial composition (e.g., precursor solution) over a relatively short period of time. For example, it can take less than five hours (e.g., less than three hours, such as less than one hour) to prepare the superconductor intermediate (e.g., metal oxyfluoride intermediate) from the initial composition subsequent to disposing the composition on the surface of the underlying layer (e.g., a substrate, buffer layer or superconductor layer).

In preferred embodiments, the intermediate (e.g., metal oxyfluoride) has a relatively low defect density. Preferably, defects contained within the layer of the intermediate make up less than about 20 percent (e.g., less than about 10 percent, or less than about five percent) of any volume element of the layer of the intermediate defined by the projection of one square centimeter of the surface of the layer of the intermediate.

Preferably, the intermediate is free of any defect having a maximum dimension of greater than about 200 microns, more preferably the intermediate is free of any defect having a maximum dimension of greater than about 100 microns, and most preferably the intermediate is free of any defect having a maximum dimension of greater than about 50 microns.

The methods of disposing the composition on the underlying layer include spin coating, dip coating, web coating and other techniques known in the art.

In some embodiments in which spin coating is used, the composition is disposed on the underlying layer and the spin rate is ramped from about zero revolutions per minute (RPM) to about 2,000 RPM in about 0.5 second. This spin rate is held for about five seconds, and the spin rate is then ramped to about 4,000 RPM in about 0.5 second. This spin rate is held for about 60 seconds, and the spin rate is then decreased to about zero RPM. As known to those skilled in the art, other spin coating conditions can also be used.

The composition is then heated. Generally, this step is performed to remove excess solvent (e.g., water and methanol) from the composition and to decompose the metalorganic molecules to one or more oxyfluoride intermediate of the desired superconductor material.

Typically, the initial temperature in this step is about room temperature, and the final temperature is from about 190° C. to about 215° C. Preferably, this step is performed using a temperature ramp of at least about 5° C. per minute, more preferably a temperature ramp of at least about 8° C. per minute, and most preferably a temperature ramp of at least about 10° C. per minute. During this step, the partial pressure of water vapor in the nominal gas environment is preferably maintained at from about 5 Torr to about 50 Torr, more preferably at from about 5 Torr to about 30 Torr, and most preferably at from about 10 Torr to about 25 Torr. The partial pressure of oxygen in the nominal gas environment is maintained at from about 0.1 Torr to about 760 Torr.

Heating is then continued to a temperature of from about 220° C. to about 290° C. (e.g., about 220° C.) using a temperature ramp of from about 0.05° C. per minute to about 0.4° C. per minute (e.g., from about 0.1° C. per minute to about 0.4° C. per minute). Preferably, the gas environment during this heating step is substantially the same as the nominal gas environment used when the sample is heated to from the initial temperature to from about 190° C. to about 215° C.

Heating is then further continued to a temperature of about 400° C. to form the oxyfluoride intermediate. This step is preferably performed using a temperature ramp of at least about 2° C. per minute, more preferably at least about 3° C. per minute, and most preferably at least about 5° C. per minute. Preferably, the gas environment during this heating step is substantially the same as the nominal gas environment used when the sample is heated to from the initial temperature to from about 190° C. to about 215° C.

The superconductor intermediate can then be heated to form the desired superconductor layer. Typically, this step is performed by heating to a temperature of from about 700° C. to about 825° C. During this step, the nominal gas environment typically contains from about 0.1 Torr to about 50 Torr oxygen and from about 0.1 Torr to about 150 Torr (e.g., about 12 Torr) of water vapor with the balance being nitrogen and/or argon.

In alternate embodiments, the coating is heated for about one hour to a temperature of less than about 860° C. (e.g., less than about 810° C.) in a moist reducing nitrogen-oxygen gas mixture (e.g., having a composition including from about 0.5% to about 5% oxygen). The coating can be further heated to a temperature of from about 860° C. to about 950° C. for from about five to about 25 minutes. The coating is subsequently heated to a temperature of from about 400° C. to about 500° C. for at least about eight hours at in dry oxygen. The coating can then be cooled to room temperature in static dry oxygen, such as described in U.S. Pat. No. 5,231,074.

In still other embodiments, the metal oxyfluoride is converted into an oxide superconductor in a processing gas having a moisture content of less than 100% relative humidity (e.g., less than about 95% relative humidity, less than about 50% relative humidity, or less than about 3% relative humidity) at 25° C. to form some oxide superconductor, then completing the conversion using a processing gas having a higher moisture content (e.g., from about 95% relative humidity to about 100% relative humidity at 25° C.). The temperature for converting the metal oxyfluoride can be in the range of from about 700° C. to about 900° C. (e.g., from about 700° C. to about 835° C.). The processing gas preferably contains from about 1 volume percent oxygen gas to about 10 volume percent oxygen gas. Such methods are described in PCT Publication No. WO 98/58415, published on Dec. 23, 1998, and entitled "Controlled Conversion of Metal Oxyfluorides into Superconducting Oxides," which is hereby incorporated by reference.

In particular embodiments, when preparing the superconductor material from the precursor solution, methods can be employed to minimize the formation of undesirable a-axis oriented oxide layer grains, by inhibiting the formation of the oxide layer until the required reaction conditions are attained.

Conventional processes developed for decomposition and reaction of fluoride-containing precursors use a constant, and low, non-turbulent flow of process gas that is introduced into the decomposition furnace in an orientation that is parallel to the film surface, resulting in a stable boundary layer at the film/gas interface. In the apparatus types typically used for oxide layer precursor decomposition and reaction, the diffusion of gaseous reactants and products through this gas/film boundary layer appears to control the overall reaction rates. In thin, small area films (for example, less than about 0.4 microns thick and less than about a square centimeter), the diffusion of $H_2O$ into the film and the diffusion of HF out of the film occur at rates such that the formation of the $YBa_2Cu_3O_{7-x}$ phase does not begin at any significant rate until the sample reaches the processing temperature. However, as the film thickness or area increases, the rates of gaseous diffusion into and out of the film decrease, all other parameters being equal. This results in longer reaction times and/or incomplete formation of the $YBa_2Cu_3O_{7-x}$ phase, resulting in reduced crystallographic texture, lower density, and reduced critical current density. Thus, the overall rate of $YBa_2Cu_3O_{7-x}$ phase formation is determined, to a significant extent, by the diffusion of gases through the boundary layer at the film surface.

One approach to eliminating these boundary layers is to produce a turbulent flow at the film surface. Under such conditions, the local gas composition at the interface is maintained essentially the same as in the bulk gas (that is, the $pH_2O$ is constant, and the pHF is approximately zero). Thus, the concentration of the gaseous products/reactants in the film is not controlled by the diffusion through the gas/film surface boundary layer condition, but rather by diffusion through the film. In order to minimize the nucleation of a-axis $YBa_2Cu_3O_{7-x}$ oriented grains on a substrate surface, the formation of the $YBa_2Cu_3O_{7-x}$ phase is inhibited until desired process conditions are reached. For example, the formation of the $YBa_2Cu_3O_{7-x}$ phase can be inhibited until desired process temperature is reached.

In one embodiment, a combination of: 1) low (non-turbulent) process gas flow, so that a stable boundary layer is established at the film/gas interface, during the ramp to temperature, and 2) high (turbulent) process gas flow, so that the boundary layer is disrupted at the film/gas interface, is employed. For example, in a three inch tube furnace, the flow can be from about 0.5 to about 2.0 L/min during the temperature ramp from ambient temperature to the desired process temperature. Thereafter, the flow can be increased to a value of from about 4 to about 15 L/min during the time at which the film is being processed. Thus, the rate of formation of $YBa_2Cu_3O_{7-x}$ and epitaxial texture formation can be increased at high temperature, while minimizing the amount of unwanted a-axis nucleation and growth at low temperature during ramp up. According to these processes, a-axis nucleated grains are desirably present in an amount of less than about 1%, as determined by scanning electron microscopy.

More details are provided in commonly owned U.S. patent application Ser. No. 09/616,566, filed on even date herewith, pending and entitled "Control of Oxide Layer Reaction Rates," which is hereby incorporated by reference.

FIG. 1 shows a multi-layer superconductor article 10 according to one embodiment of the invention and prepared using the above-described methods and compositions. Article 10 includes a substrate layer 12 with a surface 13 and a superconductor material layer 14 with a surface 15. Layer 14 is disposed on surface 13.

Layer 12 can be formed of any material capable of supporting layer 14. In embodiments in which article 10 is a multi-layer superconductor, layer 12 can be formed of a substrate material. Examples of substrate materials that can be used as layer 12 include for example, metals and/or alloys, such as nickel, silver, copper, zinc, aluminum, iron, chromium, vanadium, palladium, molybdenum and/or their alloys. In some embodiments, article 10 can be in the form of an object having a relatively large surface area (e.g., a wafer or a tape), and layer 12 can be formed of a relatively flexible material.

Surface 13 of layer 12 can also be prepared using vacuum processes, such as ion beam assisted deposition, inclined substrate deposition and other vacuum techniques known in the art to form a biaxially textured surface on, for example, a randomly oriented polycrystalline surface.

In some embodiments, a buffer layer can be formed using ion beam assisted deposition (IBAD). In this technique, a buffer layer material is evaporated using, for example, electron beam evaporation, sputtering deposition, or pulsed laser deposition while an ion beam (e.g., an argon ion beam) is directed at a smooth amorphous surface of a substrate onto which the evaporated buffer layer material is deposited.

For example, the buffer layer can be formed by ion beam assisted deposition by evaporating a buffer layer material having a rock-salt like structure (e.g., a material having a rock salt structure, such as an oxide, including MgO, or a nitride) onto a smooth, amorphous surface (e.g., a surface having a root mean square roughness of less than about 100 Angstroms) of a substrate so that the buffer layer material has a surface with substantial alignment (e.g., about 13° or less), both in-plane and out-of-plane.

The conditions used during deposition of the buffer layer material can include, for example, a substrate temperature of from about 0° C. to about 400° C. (e.g., from about room temperature to about 400° C.), a deposition rate of from about 1.0 Angstrom per second to about 4.4 Angstroms per second, an ion energy of from about 200 eV to about 1200 eV, and/or an ion flux of from about 10 microamperes per square centimeter to about 120 microamperes per square centimeter.

In some embodiments, when using IBAD, the substrate is formed of a material having a polycrystalline, non-amorphous base structure (e.g., a metal alloy, such as a nickel alloy) with a smooth amorphous surface formed of a different material (e.g., $Si_3N_4$).

In certain embodiments, a plurality of buffer layers can be deposited by epitaxial growth on an original IBAD surface. Each buffer layer can have substantial alignment (e.g., about 13° or less), both in-plane and out-of-plane.

These methods are described in PCT Publication No. WO 99/25908, published on May 27, 1999, and entitled "Thin Films Having A Rock-Salt-Like Structure Deposited on Amorphous Surfaces," which is hereby incorporated by reference.

In other embodiments, the substrate can be formed of alloys having one or more surfaces that are biaxially textured (e.g., (113)[211]) or cube textured (e.g., (100)[001] or (100)[011]). The alloys can have a relatively low Curie temperature (e.g., at most about 80K, at most about 40K, or at most about 20K).

In some of these embodiments, the substrate is a binary alloy that contains two of the following metals: copper, nickel, chromium, vanadium, aluminum, silver, iron, palladium, molybdenum, gold and zinc. For example, a binary alloy can be formed of nickel and chromium (e.g., nickel and at most 20 atomic percent chromium, nickel and from about five to about 18 atomic percent chromium, or nickel and from about 10 to about 15 atomic percent chromium). As another example, a binary alloy can be formed of nickel and copper (e.g., copper and from about five to about 45 atomic percent nickel, copper and from about 10 to about 40 atomic percent nickel, or copper and from about 25 to about 35 atomic percent nickel). A binary alloy can further include relatively small amounts of impurities (e.g., less than about 0.1 atomic percent of impurities, less than about 0.01 atomic percent of impurities, or less than about 0.005 atomic percent of impurities).

In certain of these embodiments, the substrate contains more than two metals (e.g., a ternary alloy or a quartemary alloy). In these embodiments the alloy can contain one or more oxide formers (e.g., Mg, Al, Ti, Cr, Ga, Ge, Zr, Hf, Y, Si, Pr, Eu, Gd, Tb, Dy, Ho, Lu, Th, Er, Tm, Be, Ce, Nd, Sm, Yb and/or La, with Al being the preferred oxide former), as well as two of the following metals: copper, nickel, chromium, vanadium, aluminum, silver, iron, palladium, molybdenum, gold and zinc. The alloys can contain at least about 0.5 atomic percent oxide former (e.g., at least about one atomic percent oxide former, or at least about two atomic percent oxide former) and at most about 25 atomic percent oxide former (e.g., at most about 10 atomic percent oxide former, or at most about four atomic percent oxide former). For example, the alloy can include an oxide former (e.g., at least about 0.5 aluminum), from about 25 atomic percent to about 55 atomic percent nickel (e.g., from about 35 atomic percent to about 55 atomic percent nickel, or from about 40 atomic percent to about 55 atomic percent nickel) with the balance being copper. As another example, the alloy can include an oxide former (e.g., at least about 0.5 atomic aluminum), from about five atomic percent to about 20 atomic percent chromium (e.g., from about 10 atomic percent to about 18 atomic percent chromium, or from about 10 atomic percent to about 15 atomic percent chromium) with the balance being nickel. The alloys can include relatively small amounts of additional metals (e.g., less than about 0.1 atomic percent of additional metals, less than about 0.01 atomic percent of additional metals, or less than about 0.005 atomic percent of additional metals).

A substrate formed of an alloy can be produced by, for example, combining the constituents in powder form, melting and cooling or, for example, by diffusing the powder constituents together in solid state. The alloy can then be formed by deformation texturing (e.g, annealing and rolling, swaging and/or drawing) to form a textured surface (e.g., biaxially textured or cube textured). Alternatively, the alloy constituents can be stacked in a jelly roll configuration, and then deformation textured. In some embodiments, a material with a relatively low coefficient of thermal expansion (e.g., Nb, Mo, Ta, V, Cr, Zr, Pd, Sb, NbTi, an intermetallic such as NiAl or $Ni_3Al$, or mixtures thereof) can be formed into a rod and embedded into the alloy prior to deformation texturing.

These methods are described in commonly owned U.S. patent application No. Ser. 09/283,775, filed Mar. 31, 999, now U.S. Pat. No. 6,475,311, and entitled "Alloy Materials;" commonly owned U.S. patent application Ser. No. 09/283,777, filed Mar 31, 1999, now U.S. Pat. No. 6,458,223, and entitled "Alloy Materials;" PCT Publication No. WO 99/17307, published on Apr. 8, 1999, and entitled "Substrates with Improved Oxidation Resistance;" and PCT Publication No. WO 99/16941, published on Apr. 8, 1999, and entitled "Substrates for Superconductors," all of which are hereby incorporated by reference.

In some embodiments, stable oxide formation can be mitigated until a first epitaxial (for example, buffer) layer is formed on the biaxially textured alloy surface, using an intermediate layer disposed on the surface of the substrate. Intermediate layers suitable for use in the present invention include those epitaxial metal or alloy layers that do not form surface oxides when exposed to conditions as established by $P_{O2}$ and temperature required for the initial growth of epitaxial buffer layer films. In addition, the buffer layer acts as a barrier to prevent substrate element(s) from migrating to the surface of the intermediate layer and forming oxides during the initial growth of the epitaxial layer. Absent such an intermediate layer, one or more elements in the substrate would be expected to form thermodynamically stable oxide (s) at the substrate surface which could significantly impede the deposition of epitaxial layers due to, for example, lack of texture in this oxide layer.

In some of these embodiments, the intermediate layer is transient in nature. "Transient," as used herein, refers to an intermediate layer that is wholly or partly incorporated into or with the biaxially textured substrate following the initial nucleation and growth of the epitaxial film. Even under these circumstances, the intermediate layer and biaxially textured substrate remain distinct until the epitaxial nature of the deposited film has been established. The use of transient intermediate layers may be preferred when the intermediate layer possesses some undesirable property, for example, the intermediate layer is magnetic, such as nickel.

Exemplary intermediate metal layers include nickel, gold, silver, palladium, and alloys thereof. Additional metals or alloys may include alloys of nickel and/or copper. Epitaxial films or layers deposited on an intermediate layer can include metal oxides, chalcogenides, halides, and nitrides. In preferred embodiments, the intermediate metal layer does not oxidize under epitaxial film deposition conditions.

Care should be taken that the deposited intermediate layer is not completely incorporated into or does not completely diffuse into the substrate before nucleation and growth of the initial buffer layer structure causes the epitaxial layer to be established. This means that after selecting the metal (or alloy) for proper attributes such as diffusion constant in the substrate alloy, thermodynamic stability against oxidation under practical epitaxial buffer layer growth conditions and lattice matching with the epitaxial layer, the thickness of the deposited metal layer has to be adapted to the epitaxial layer deposition conditions, in particular to temperature.

Deposition of the intermediate metal layer can be done in a vacuum process such as evaporation or sputtering, or by electro-chemical means such as electroplating (with or without electrodes). These deposited intermediate metal layers may or may not be epitaxial after deposition (depending on substrate temperature during deposition), but epitaxial orientation can subsequently be obtained during a post-deposition heat treatment.

Preferably, surface 13 of layer 12 has a relatively well defined crystallographic orientation. For example, surface 13 can be a biaxially textured surface (e.g., a (113)[211] surface) or a cube textured surface (e.g., a (100)[011] surface or a (100)[001] surface). Preferably, the peaks in an X-ray diffraction pole figure of surface 13 have a FWHM of less than about 20° (e.g., less than about 15°, less than about 10°, or from about 5° to about 10°).

Layer 14 can be prepared using the above-described methods. Preferably, layer 14 is formed of a rare earth metal-barium-copper-oxide (REBCO), such as YBCO (e.g., $YBa_2Cu_3O_{7-x}$). Preferably, layer 14 has a thickness of from about 0.3 micron to about 10 microns. In some embodiments, layer 14 can be thicker or thinner.

In preferred embodiments, layer 14 has a relatively low defect density. Preferably, defects contained within layer 14 make up less than about 20 percent (e.g., less than about 10 percent, or less than about five percent) of any volume element of layer 14 defined by the projection of one square centimeter of surface 15.

Preferably, layer 14 is free of any defect having a maximum dimension of greater than about 200 microns, more preferably layer 14 is free of any defect having a maximum dimension of greater than about 100 microns, and most preferably layer 14 is free of any defect having a maximum dimension of greater than about 50 microns.

Superconductor layer 14 preferably has a critical current density of at least about $1 \times 10^6$ Amperes per square centimeter, more preferably at least about $1.5 \times 10^6$ Amperes per square centimeter, and most preferably at least about $2 \times 10^6$ Amperes per square centimeter as determined by transport measurement at 77K and self field (i.e., no applied field) using a one microVolt per centimeter criterion.

Figure 2:
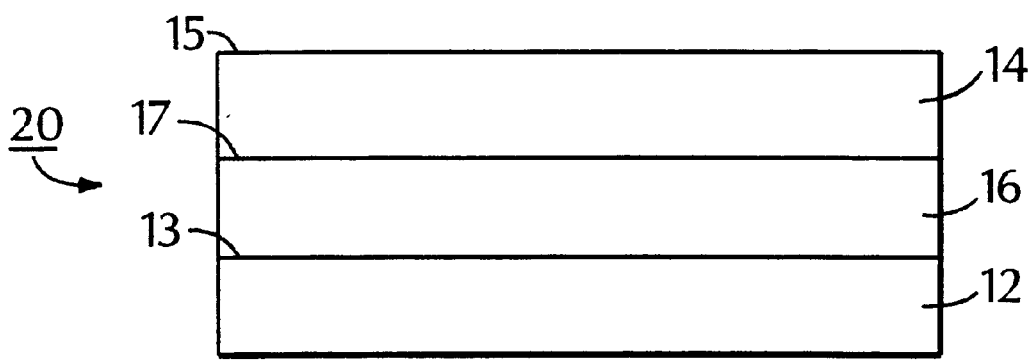
FIG. 2 is a cross-sectional view of another embodiment of a multi-layer article.

FIG. 2 shows an embodiment of an article 20 that can be formed by the methods of the invention. article 20 includes layers 12 and 14. article 20 also includes a layer 16 disposed between layers 12 and 14 such that layer 16 is disposed on surface 13 and layer 14 is disposed on a surface 17 of layer 16.

Layer 16 can be formed of any material capable of supporting layer 14. For example, layer 16 can be formed of a buffer layer material. Examples of buffer layer materials include metals and metal oxides, such as silver, nickel, $TbO_x$, $GaO_x$, $CeO_2$, yttria-stabilized zirconia (YSZ), $Y_2O_3$, $LaAlO_3$, $SrTiO_3$, $LaNiO_3$, $Gd_2O_3$, $LaCuO_3$, $SrRuO_3$, $NdGaO_3$, $NdAlO_3$ and nitrides as known in the art. A buffer material can be prepared using solution phase techniques, includingmetalorganic deposition, such as disclosed in, for example, S. S. Shoup et al., J. Am. Cer. Soc., vol. 81, 3019; D. Beach et al., Mat. Res. Soc. Symp. Proc., vol. 495, 263 (1988); M. Paranthaman et al., Superconductor Sci. Tech., vol. 12, 319 (1999); D. J. Lee et al., Japanese J. Appl. Phys., vol. 38, L178 (1999) and M. W. Rupich et al., I.E.E.E. Trans. on Appl. Supercon. vol. 9, 1527.

In certain embodiments, solution coating processes can be used for deposition of one or a combination of any of the oxide layers on textured substrates; however, they can be particularly applicable for deposition of the initial (seed) layer on a textured metal substrate. The role of the seed layer is to provide 1) protection of the substrate from oxidation during deposition of the next oxide layer when carried out in an oxidizing atmosphere relative to the substrate (for example, magnetron sputter deposition of yttria-stabilized zirconia from an oxide target); and 2) an epitaxial template for growth of subsequent oxide layers. In order to meet these requirements, the seed layer should grow epitaxially over the entire surface of the metal substrate and be free of any contaminants that may interfere with the deposition of subsequent epitaxial oxide layers.

The formation of oxide buffer layers can be carried out so as to promote wetting of an underlying substrate layer. Additionally, in particular embodiments, the formation of metal oxide layers can be carried out using metal alkoxide precursors (for example, "sol gel" precursors), in which the level of carbon contamination can be greatly reduced over other known processes using metal alkoxide precursors.

If the substrate underlying an oxide layer is insufficiently covered by a precursor solution used to make the oxide layer, then the oxide layer will not provide the desired protection of the substrate from oxidation during deposition of the subsquent oxide layers when carried out in an oxidizing atmosphere relative to the substrate and will not provide a complete template for the epitaxial growth of subsquent layers. By heating a sol gel precursor film, and thereby allowing the precursor to flow into the substrate grain boundary areas, complete coverage can result. The heating can be relatively low temperature, for example, from about 80° C. to about 320° C., for example, from about 100° C. to about 300° C., or from about 100° C. to about 200° C. Such temperatures can be maintained from about 1 to about 60 minutes, for example, from about 2 to about 45 minutes, or from about 15 to about 45 minutes. The heating step can also be carried out using higher temperatures for a shorter time, for example, a film can be processed within two minutes at a temperature of 300° C.

This heating step can be carried out after, or concurrently with, the drying of excess solvent from the sol gel precursor film. It must be carried out prior to decomposition of the precursor film, however.

The carbon contamination accompanying conventional oxide film preparation in a reducing environment (e.g., 4% $H_2$—Ar) is believed to be the result of an incomplete removal of the organic components of the precursor film. The presence of carbon-containing contaminants $C_xH_y$ and $C_aH_bO_c$ in or near the oxide layer can be detrimental, since they can alter the epitaxial deposition of subsequent oxide layers. Additionally, it is likely that the trapped carbon-containing contaminants buried in the film can be oxidized during the processing steps for subsequent oxide layers, which can utilize oxidizing atmospheres. The oxidation of the carbon-containing contaminants can result in $CO_2$ formation, and the subsequent blistering of the film, and possible delamination of the film, or other defects in the composite structure. Thus, it is undesirable to allow carbon-containing contaminants arising from metal alkoxide decomposition to become oxidized only after the oxide layer is formed. Preferably, the carbon-containing contaminants are oxidized (and hence removed from the film structure as $CO_2$) as the decomposition occurs. Also the presence of carbon-containing species on or near film surfaces can inhibit the epitaxial growth of subsequent oxide layers.

According to particular embodiments, after coating a metal substrate or buffer layer, the precursor solution can be air dried, and then heated in an initial decomposition step. Alternatively, the precursor solution can be directly heated in an initial decomposition step, under an atmosphere that is reducing relative to the metal substrate. Once the oxide layer initially nucleates on the metal substrate in the desired epitaxial orientation, the oxygen level of the process gas is increased, for example, by adding water vapor or oxygen. The nucleation step requires from about 5 minutes to about 30 minutes to take place under typical conditions.

These methods are described in U.S. patent application Ser. No. 09/617,520, filed on even date herewith, abandoned Mar. 8, 2002, and entitled "Enhanced Purity Oxide Layer Formation" which is hereby incorporated by reference.

In certain embodiments, an epitaxial buffer layer can be formed using a low vacuum vapor deposition process (e.g., a process performed at a pressure of at least about $1\times10^{-3}$ Torr). The process can include forming the epitaxial layer using a relatively high velocity and/or focused gas beam of buffer layer material.

The buffer layer material in the gas beam can have a velocity of greater than about one meter per second (e.g., greater than about 10 meters per second or greater than about 100 meters per second). At least about 50% of the buffer layer material in the beam can be incident on the target surface (e.g., at least about 75% of the buffer layer material in the beam can be incident on the target surface, or at least about 90% of the buffer layer material in the beam can be incident on the target surface).

The method can include placing a target surface (e.g., a substrate surface or a buffer layer surface) in a low vacuum environment, and heating the target surface to a temperature which is greater than the threshold temperature for forming an epitaxial layer of the desired material on the target surface in a high vacuum environment (e.g., less than about $1\times10^{-3}$ Torr, such as less than about $1\times10^{-4}$ Torr) under otherwise identical conditions. A gas beam containing the buffer layer material and optionally an inert carrier gas is directed at the target surface at a velocity of at least about one meter per second. A conditioning gas is provided in the low vacuum environment. The conditioning gas can be contained in the gas beam, or the conditioning gas can be introduced into the low vacuum environment in a different manner (e.g., leaked into the environment). The conditioning gas can react with species (e.g., contaminants) present at the target surface to remove the species, which can promote the nucleation of the epitaxial buffer layer.

The epitaxial buffer layer can be grown on a target surface using a low vacuum (e.g., at least about $1\times10^{-3}$ Torr, at least about 0.1 Torr, or at least about 1 Torr) at a surface temperature below the temperature used to grow the epitaxial layer using physical vapor deposition at a high vacuum (e.g., at most about $1\times10^{-4}$ Torr). The temperature of the target surface can be, for example, from about 25° C. to about 800° C. (e.g., from about 500° C. to about 800° C., or form about 500° C. to about 650° C.).

The epitaxial layer can be grown at a relatively fast rate, such as, for example, at least about 50 Angstroms per second.

These methods are described in U.S. Pat. No. 6,027,564, issued Feb. 22, 2000, and entitled "Low Vacuum Process for Producing Epitaxial Layers;" U.S. Pat. No. 6,022, 832, issued Feb. 8, 2000, and entitled "Low Vacuum Process for Producing Superconductor Articles with Epitaxial Layers;" and/or commonly owned U.S. patent application Ser. No. 09/007,372, filed Jan. 15, 1998, abandoned Jan. 26, 2001, and entitled "Low Vacuum Process for Producing Epitaxial Layers of Semiconductor Material," all of which are hereby incorporated by reference.

In alternate embodiments, an epitaxial buffer layer can be deposited by sputtering from a metal or metal oxide target at a high throughput. Heating of the substrate can be accomplished by resistive heating or bias and electric potential to obtain an epitaxial morphology. A deposition dwell may be used to form an oxide epitaxial film from a metal or metal oxide target.

The oxide layer typically present on substrates can be removed by exposure of the substrate surface to energetic ions within a reducing environment, also known as Ion Beam etching. Ion Beam etching can be used to clean the substrate prior to film deposition, by removing residual oxide or impurities from the substrate, and producing an essentially oxidefree preferably biaxially textured substrate surface. This improves the contact between the substrate and subsequently deposited material. Energetic ions can be produced by various ion guns, for example, which accelerate ions such as $Ar^+$ toward a substrate surface. Preferably, gridded ion sources with beam voltages greater than 150 ev are utilized. Alternatively, a plasma can be established in a region near the substrate surface. Within this region, ions chemically interact with a substrate surface to remove material from that surface, including metal oxides, to produce substantially oxide-free metal surface.

Another method to remove oxide layers from a substrate is to electrically bias the substrate. If the substrate tape or wire is made negative with respect to the anode potential, it will be subjected to a steady bombardment by ions from the gas prior to the deposition (if the target is shuttered) or during the entire film deposition. This ion bombardment can clean the wire or tape surface of absorbed gases that might otherwise be incorporated in the film and also heat the substrate to elevated deposition temperatures. Such ion bombardment can be further advantageous by improving the density or smoothness of the epitaxial film.

Upon formation of an appropriately textured, substantially oxide-free substrate surface, deposition of a buffer layer can begin. One or more buffer layers, each including a single metal or oxide layer, can be used. In some preferred embodiments, the substrate is allowed to pass through an apparatus adapted to carry out steps of the deposition method of these embodiments. For example, if the substrate is in the form of a wire or tape, the substrate can be passed linearly from a payout reel to a take-up reel, and steps can be performed on the substrate as it passes between the reels.

According to some embodiments, substrate materials are heated to elevated temperatures which are less than about 90% of the melting point of the substrate material but greater than the threshold temperature for forming an epitaxial layer of the desired material on the substrate material in a vacuum environment at the predetermined deposition rate. In order to form the appropriate buffer layer crystal structure and buffer layer smoothness, high substrate temperatures are generally preferred. Typical lower limit temperatures for the growth of oxide layers on metal are approximately 200° C. to 800° C., preferably 500° C. to 800° C., and more preferably, 650° C. to 800° C. Various well-known methods such as radiative heating, convection heating, and conduction heating are suitable for short (2 cm to 10 cm) lengths of substrate, but for longer (1 m to 100 m) lengths, these techniques may not be well suited. Also to obtain desired high throughput rates in a manufacturing process, the substrate wire or tape must be moving or transferring between deposition stations during the process. According to particular embodiments, the substrates are heated by resistive heating, that is, by passing a current through the metal substrate, which is easily scaleable to long length manufacturing processes. This approach works well while instantaneously allowing for rapid travel between these zones. Temperature control can be accomplished by using optical pyrometers and closed loop feedback systems to control the power supplied to the substrate being heated. Current can be supplied to the substrate by electrodes which contact the substrate in at least two different segments of the substrate. For example, if the substrate, in the form of a tape or wire, is passed between reels, the reels themselves could act as electrodes. Alternatively, if guides are employed to transfer the substrate between reels, the guides could act as electrodes. The electrodes could also be completely independent of any guides or reels as well. In some preferred embodiments, current is applied to the tape between current wheels.

In order that the deposition is carried out on tape that is at the appropriate temperature, the metal or oxide material that is deposited onto the tape is desirably deposited in a region between the current wheels. Because the current wheels can be efficient heat sinks and can thus cool the tape in regions proximate to the wheels, material is desirably not in regions proximate to the wheels. In the case of sputtering, the charged material deposited onto the tape is desirably not influenced by other charged surfaces or materials proximate to the sputter flux path. For this reason, the sputter chamber is preferably configured to place components and surfaces which could influence or deflect the sputter flux, including chamber walls, and other deposition elements, in locations distant from the deposition zone so that they do not alter the desired linear flux path and deposition of metal or metal oxide in regions of the tape at the proper deposition temperature.

More details are provided in commonly owned U.S. patent application Ser. No. 09/500,701, filed on Feb. 9, 2000, abondoned Jul. 5, 2002, and entitled "Oxide Layer Method," and commonly owned U.S. patent application Ser. No. 09/615,669, filed on even date herewith, abandoned Jan. 14, 2002, and entitled "Oxide Layer Method," both of which are hereby incorporated by reference in their entirety.

In certain embodiments, layers 14 and/or 16 can be conditioned (e.g., thermally conditioned and/or chemically conditioned) so that surfaces 15 and/or 17 is be biaxially textured (e.g., (113)[211]) or cube textured (e.g., (100)[011] or (100)[011]), has peaks in an X-ray diffraction pole figure that have a full width at half maximum of less than about 20° (e.g., less than about 15°, less than about 10°, or from about 5° to about 10°), is smoother than before conditioning as determined by high resolution scanning electron microscopy or atomic force microscopy, has a relatively high density, has a relatively low density of impurities, exhibit enhanced adhesion to other material layers (e.g., a superconductor layer or a buffer layer) and/or exhibits a relatively small rocking curve width as measured by x-ray diffraction.

"Chemical conditioning" as used herein refers to a process which uses one or more chemical species (e.g., gas phase chemical species and/or solution phase chemical species) to affect changes in the surface of a material layer, such as a buffer layer or a superconductor material layer, so that the resulting surface exhibits one or more of the above noted properties.

"Thermal conditioning" as used herein refers to a process which uses elevated temperature to affect changes in the surface of a material layer, such as a buffer layer or a superconductor material layer, so that the resulting surface exhibits one or more of the above noted properties. Thermal conditioning can be performed with or without the use of chemical conditioning. Preferably, thermal conditioning occurs in a controlled environment (e.g., controlled gas pressure, controlled gas environment and/or controlled temperature).

Thermal conditioning can include heating the surface of the layer 16 to a temperature at least about 5° C. above the deposition temperature or the crystallization temperature of the underlying layer (e.g., from about 15° C. to about 500° C. above the deposition temperature or the crystallization temperature of the underlying layer, from about 75° C. to about 300° C. above the deposition temperature or the crystallization temperature of the underlying layer, or from about 150° C. to about 300° C. above the deposition temperature or the crystallization temperature of the underlying layer). Examples of such temperatures are from about 500° C. to about 1200° C. (e.g., from about 800° C. to about 1050° C.). Thermal conditioning can be performed under a variety of pressure conditions, such as above atmospheric pressure, below atmospheric pressure, or at atmospheric pressure. Thermal conditioning can also be performed using a variety of gas environments, such as a chemical conditioning environment (e.g., an oxidizing gas environment, a reducing gas environment) or an inert gas environment.

"Deposition temperature" as used herein refers to the temperature at which the layer being conditioned was deposited.

"Crystallization temperature" as used herein refers to the temperature at which a layer of material (e.g., the underlying layer) takes on a crystalline form.

Chemical conditioning can include vacuum techniques (e.g., reactive ion etching, plasma etching and/or etching with fluorine compounds, such as $BF_3$ and/or $CF_4$). Chemical conditioning techniques are disclosed, for example, in *Silicon Processing for the VLSI Era*, Vol. 1, eds. S. Wolf and R. N. Tanber, pp. 539–574, Lattice Press, Sunset Park, Calif., 1986.

Alternatively or additionally, chemical conditioning can involve solution phase techniques, such as disclosed in *Metallurgy and Metallurgical Engineering Series*, 3d ed., George L. Kehl, McGraw-Hill, 1949. Such techniques can include contacting the surface of the underlying layer with a relatively mild acid solution (e.g., an acid solution containing less about 10 percent acid, less than about two percent acid, or less than about one percent acid). Examples of mild acid solutions include perchloric acid, nitric acid, hydrofluoric acid, hydrochloric acid, acetic acid and buffered acid solutions. In one embodiment, the mild acid solution is about one percent aqueous nitric acid. In certain embodiments, bromide-containing and/or bromine-containing compositions (e.g., a liquid bromine solution) can be used to condition the surface of a buffer layer or a superconductor layer.

Methods of conditioning a surface are described in commonly owned U.S. Provisional Patent Application No. 60/166,140, filed Nov. 18, 1999, and entitled "Multi-Layer Articles and Methods of Making Same," and commonly owned U.S. patent application Ser. No. 09/616,810, filed on even date herewith, now pending and entitled "Multi-layer Articles and Methods of Making Same," both of which are hereby incorporated by reference.

In alternate embodiments, layer 16 can be formed of a layer of superconductor material, such as an oxide superconductor material. Examples of such materials include REBCO, such as YBCO (e.g., $YBa_2Cu_3O_{7-x}$). In these embodiments, layer 16 can be prepared using the above described methods.

In certain embodiments, where layer 16 is formed of a superconductor material, layer 14 can be from solid-state, or semi solid state, precursor materials deposited in the form of a dispersion. These precursor compositions allow for example the substantial elimination of $BaCO_3$ formation in final YBCO superconducting layers, while also allowing control of film nucleation and growth.

Two general approaches are presented for the formulation of precursor compositions. In one approach, the cationic constituents of the precursor composition are provided in components taking on a solid form, either as elements, or preferably, compounded with other elements. The precursor composition is provided in the form of ultrafine particles which are dispersed so that they can be coated onto and adhere onto the surface of a suitable substrate, intermediate-coated substrate, or buffer-coated substrate. These ultrafine particles can be created by aerosol spray, by evaporation or by similar techniques which can be controlled to provide the chemical compositions and sizes desired. The ultrafine particles are less than about 500 nm, preferably less than about 250 nm, more preferably less than about 100 nm and even more preferably less than about 50 nm. In general, the particles are less than about 50% the thickness of the desired final film thickness, preferably less than about 30% most preferably less than about 10% of the thickness of the desired final film thickness. For example, the precursor composition can comprise ultrafine particles of one or more of the constituents of the superconducting layer in a substantially stoichiometric mixture, present in a carrier. This carrier comprises a solvent, a plasticizer, a binder, a dispersant, or a similar system known in the art, to form a dispersion of such particles. Each ultrafine particle can contain a substantially compositionally uniform, homogeneous mixture of such constituents. For example, each particle can contain $BaF_2$, and rare-earth oxide, and copper oxide or rare earth/barium/copper oxyfluoride in a substantially stoichiometric mixture. Analysis of such particles would desirably reveal a rare-earth:barium:copper ratio as substantially 1:2:3 in stoichiometry, with a fluorine:barium ratio of substantially 2:1 in stoichiometry. These particles can be either crystalline, or amorphous in form.

In a second approach, the precursor components can be prepared from elemental sources, or from a substantially stoichiometric compound comprising the desired constituents. For example, evaporation of a solid comprising a substantially stoichiometric compound of desired REBCO constituents (for example, $YBa_2Cu_3O_{7-x}$) or a number of solids, each containing a particular constituent of the desired final superconducting layer (for example, $Y_2O_3$, $BaF_2$, CuO) could be used to produce the ultrafine particles for production of the precursor compositions. Alternatively, spray drying or aerosolization of a metalorganic solution comprising a substantially stoichiometric mixture of desired REBCO constituents could be used to produce the ultrafine particles used in the precursor compositions. Alternatively, one or more of the cationic constituents can be provided in the precursor composition as a metalorganic salt or metalorganic compound, and can be present in solution. The metalorganic solution can act as a solvent, or carrier, for the other solid-state elements or compounds. According to this embodiment, dispersants and/or binders can be substantially eliminated from the precursor composition. For example, the precursor composition can comprise ultrafine particles of rare-earth oxide and copper oxide in substantially a 1:3 stoichiometric ratio, along with a solublized barium-containing salt, for example, barium-trifluoroacetate dissolved in an organic solvent, such as methanol.

If the superconducting layer is of the REBCO type, the precursor composition can contain a rare earth element, barium, and copper in the form of their oxides; halides such as fluorides, chlorides, bromides and iodides; carboxylates and alcoholates, for example, acetates, including trihaloacetates such as trifluroracetates, formates, oxalates, lactates, oxyfluorides, propylates, citrates, and acetylacetonates, and, chlorates and nitrates. The precursor composition can include any combination of such elements (rare earth element, barium, and copper) in their various forms, which can convert to an intermediate containing a barium halide, plus rare earth oxyfluoride and copper(oxyfluoride) without a separate decomposition step or with a decomposition step that is substantially shorter than that which may be required for precursors in which all constituents are solubilized, and without substantial formation of $BaCO_3$, and which can subsequently be treated using high temperature reaction processes to yield an epitaxial REBCO film with $T_c$ of no less than about 89K, and $J_c$ greater than about 500,000 $A/cm^2$ at a film thickness of 1 micron or greater. For example, for a $YBa_2Cu_3O_{7-x}$ superconducting layer, the precursor composition could contain barium halide (for example, barium fluoride), yttrium oxide (for example, $Y_2O_3$), and copper oxide; or yttrium oxide, barium trifluoroacetate in a trifluoroacetate/methanol solution, and a mixture of copper oxide and copper trifluoroacetate in trifluoroacetate/methanol. Alternatively, the precursor composition could contain Batrifluoroacetate, $Y_2O_3$, and CuO. Alternatively, the precursor composition could contain barium trifluoroacetate and yttrium trifluoroacetate in methanol, and CuO. Alternatively, the precursor composition could contain $BaF_2$ and yttrium acetate and CuO. In some preferred embodiments, barium-containing particles are present as $BaF_2$ particles, or barium fluoroacetate. In some embodiments the precursor could be substantially a solublized metalorganic salt containing some or all of the cation constituents, provided at least a portion of one of the compounds containing cation constituents present in solid form. In certain embodiments, the precursor in a dispersion includes a binder and/or a dispersant and/or solvent(s).

The precursor compositions can be applied to substrate or buffer-treated substrates by a number of methods, which are designed to produce coatings of substantially homogeneous thickness. For example, the precursor compositions can be applied using spin coating, slot coating, gravure coating, dip coating, tape casting, or spraying. The substrate is desirably uniformly coated to yield a superconducting film of from about 1 to 10 microns, preferably from about 1 to 5 microns, more preferably from about 2 to 4 microns.

More details are provided in commonly owned U.S. patent application Ser. No. 09/500,717, filed on Feb. 9, 2000, now pending and entitled "Coated Conductor Thick Film Precursor," which is hereby incorporated by reference in its entirety.

Figure 3:
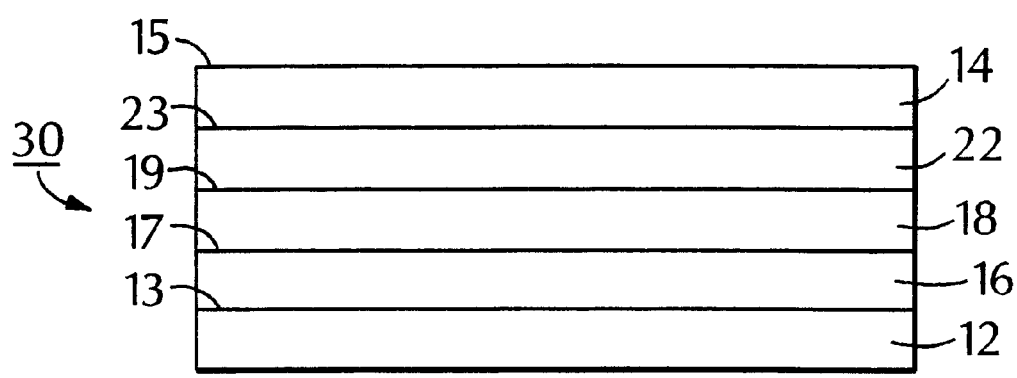
FIG. 3 is a cross-sectional view of a further embodiment of a multi-layer article.

While the foregoing discussion has described multi-layer articles having two layers of material (i.e., no intermediate layer) and three layers of material (i.e., one intermediate layer), the invention is not limited in this sense. Instead, multiple intermediate layers can be used. Each of the intermediate layers can be formed of a buffer layer material or a superconductor material. For example, FIG. 3 shows a multi-layer superconductor article 30 according to yet another embodiment of the invention. Article 30 includes layers 12, 14 and 16. Article 30 further includes an additional intermediate layers 18 and 22 having surfaces 19 and 23, respectively. Layers 18 and 22 are disposed between layers 16 and 14. Each of layers 16, 18 and 22 can be formed of a buffer layer material or a superconductor material.

In preferred embodiments, a superconductor article includes three buffer layers between the substrate and superconductor material. A layer of $Y_2O_3$ or $CeO_2$ (e.g., from about 20 nanometers to about 50 nanometers thick) is deposited (e.g., using electron beam evaporation) onto the substrate surface. A layer of YSZ (e.g., from about 0.2 micron to about 1 micron thick, such as about 0.5 micron thick) is deposited onto the surface of the $Y_2O_3$ or $CeO_2$ layer using sputtering (e.g, using magnetron sputtering). A $CeO_2$ layer (e.g., about 20 nanometers thick) is deposited (e.g, using magnetron sputttering) onto the YSZ surface. One or more of the buffer layers can be chemically and/or thermally conditioned as described herein.

Superconductor articles according to the invention can also include a layer of a cap material which can be formed of a metal or alloy whose reaction products with the superconductor material (e.g., $YBa_2Cu_3O_{7-x}$) are thermodynamically unstable under the reaction conditions used to form the layer of cap material. Exemplary cap materials include silver, gold, palladium and platinum.

In addition, while the foregoing discussion has described multi-layer articles having certain structures, the invention is not limited in this sense. For example, in some embodiments, multi-layer high temperature superconductors are provided, including first and second high temperature superconductor coated elements. Each element includes a substrate, at least one buffer layer deposited on the substrate, a high temperature superconductor layer, and optionally a cap layer. The first and second high temperature superconductor coated elements can be joined at the first and second cap layers, or can be joined with an intervening, preferably metallic, layer. Exemplary joining techniques include soldering and diffusion bonding.

Such a multi-layer architecture provides improved current sharing, lower hysteretic losses under alternating current conditions, enhanced electrical and thermal stability, and improved mechanical properties. Useful conductors can be made having multiple tapes stacked relative to one another and/or laminated to provide sufficient ampacity, dimensional stability, and mechanical strength. Such embodiments also provide a means for splicing coated tape segments and for termination of coated tape stackups or conductor elements.

Moreover, it is expected that this architecture can provide significant benefits for alternating current applications. AC losses are shown to be inversely proportional to the effective critical current density within the conductor, more specifically, the cross-sectional area within which the current is carried. For a multifilimentary conductor, this would be the area of the "bundle" of superconducting filaments, excluding any sheath material around that bundle. For a "face-to-face" architecture, the "bundle" critical current density would encompass only the high temperature superconductor films and the thickness of the cap layer structure. The cap layer can be formed of one or more layers, and preferably includes at least one noble metal layer. "Noble metal," as used herein, is a metal, the reaction products of which are thermodynamically unstable under the reaction conditions employed to prepare the HTS tape. Exemplary noble metals include, for example, silver, gold, palladium, and platinum. Noble metals provide a low interfacial resistance between the HTS layer and the cap layer. In addition, the cap layer can include a second layer of normal metal (for example, copper or aluminum or alloys of normal metals). In direct current applications, additional face-to-face wires would be bundled or stacked to provide for the required ampacity and geometry for a given application.

Additionally, the high temperature superconductor film on the surface of the tapes could be treated to produce local breaks, that is, non-superconducting regions or stripes in the film only along the length of the tape (in the current flow direction). The cap layer deposited on the high temperature superconductor film would then serve to bridge the nonsuperconducting zones with a ductile normal metal region. An offset in the edge justification of the narrow strips or filaments, similar to a running bond brick pattern, would allow current to transfer to several narrow superconducting filaments both across the cap layers and to adjacent filaments, further increasing the redundancy and improving stability.

In all embodiments, a normal metal layer could be included along the edge of the conductor to hermetically seal the high temperature superconductor films and to provide for current transfer into the film, and if necessary, from the film into the substrate.

More details are provided in commonly owned U.S. Provisional Patent Application Serial No. 60/145,468, filed on Jul. 23, 1999, and entitled "Enhanced High Temperature Coated Superconductors," and commonly owned U.S. patent application Ser. No. 09/617,518, filed concurrently herewith, now pending and entitled "Enhanced High Temperature Coated Superconductors," both of which are hereby incorporated by reference in its entirety.

In some embodiments, coated conductors can be fabricated in a way that minimizes losses incurred in alternating current applications. The conductors are fabricated with multiple conducting paths, each of which comprises path segments which extend across at least two conducting layers, and further extend between these layers.

Each superconducting layer has a plurality of conductive path segments extending across the width of the layer, from one edge to another, and the path segments also have a component of direction along the length of the superconducting layer. The path segments in the superconducting layer surface are in electrically conductive communication with interlayer connections, which serve to allow current to flow from one superconducting layer to another. Paths, which are made up of path segments, are periodically designed, so that current flow generally alternates between two superconducting layers in bilayered embodiments, and traverses the layers through interlayer connections.

Superconducting layers can be constructed to contain a plurality of path segments which extend both across their widths and along their lengths. For example, superconducting layers can be patterned so as to achieve a high resistivity or a fully insulating barrier between each of the plurality of path segments. For example, a regular periodic array of diagonal path segments can be imposed on the layer along the full length of the tape. Patterning of superconducting layers to give such arrays can be accomplished by a variety of means known to those skilled in the art, including for example, laser scribing, mechanical cutting, implantation, localized chemical treatment through a mask, and other known methods. Further, the superconducting layers are adapted to allow the conductive path segments in their surfaces to electrically communicate with conducting interlayer connections passing between the layers, at or near their edges. The interlayer connections will typically be normally conducting (not superconducting) but in special configurations could also be superconducting. Interlayer connections provide electrical communication between superconducting layers which are separated by non-conducting or highly resistive material which is positioned between the superconducting layers. Such non-conducting or highly resistive material can be deposited on one superconducting layer. Passages can be fabricated at the edges of the insulating material to allow the introduction of interlayer connections, followed by deposition of a further superconducting layer. One can achieve a transposed configuration with coated conductors by patterning a superconducting layer into filaments parallel to the axis of the tape and winding the tape in a helical fashion around a cylindrical form.

More details are provided in commonly owned U.S. patent application Ser. No. 09/500,718, filed on Feb. 9, 2000, and entitled "Coated Conductors with Reduced AC Loss," which is hereby incorporated by reference in its entirety.

The following examples are illustrative only. In these examples, magnetron sputtering was conducted using a magnetron sputtering power density of from about 25 Watts per square inch to about 50 Watts per square inch and a chamber pressure of from about 10 milliTorr to about 25 milliTorr.

EXAMPLE I

A precursor solution was prepared as follows. About 51.4 grams of $Y(CH_3CO_2)_3.4H_2O$ were dissolved in about 514 grams of water. About 77.6 grams of $Ba(CH_3CO_2)_2$ were dissolved in about 388 grams of water, and about 91 grams of $Cu(CH_3CO_2)_2.H2O$ were dissolved in about 1365 grams of water. These three solutions were then mixed together. About 243 grams of the resulting solution were mixed with about 10 milliliters of pure trifluoroacetic acid. This solution was dried under vacuum at about 60° C. until all solvents were removed and only a solid remained. The solid was then dissolved in methanol and diluted to a total volume of about 50 milliliters to form a precursor solution.

EXAMPLE II

A multi-layer article was prepared as follows. The precursor solution prepared in Example I was spin coated onto a buffered substrate formed of $CeO_2/YSZ/CeO_2/Ni$.

The buffered substrate was prepared by rolling deformation of a nickel sample to greater than about 97% to form a tape. The tape was annealed at about 1000° C. for about an hour to form a well cube textured material. An about 30 nanometer thick layer of $CeO_2$ was deposited onto the textured nickel surface at a rate of about one Angstrom per second using electron beam evaporation and a temperature of about 625° C. An about 300 nanometer thick layer of YSZ was deposited on the $CeO_2$ layer at a rate of about 0.5 Angstroms per second using radio frequency sputtering at a temperature of about 725° C. An about 20 nanometer thick layer of $CeO_2$ was deposited on the YSZ layer at a rate of about 0.7 Angstroms per second using radio frequency sputtering and a temperature of about 725° C.

The spin coating protocol was as follows. The buffered $CeO_2/YSZ/CeO_2/Ni$ substrate was ramped from about zero revolutions per minute (RPM) to about 2000 RPM in about 0.5 second. The spin speed was held at about 2000 RPM for about five seconds and then ramped to about 4000 RPM in about 0.5 second. The spin speed was held at about 4000 RPM for about 60 seconds then reduced to about zero RPM.

The coated sample was decomposed as follows. The sample was heated from room temperature to about 210° C. at a rate of about 10° C. per minute in a nominal gas environment having a total gas pressure of about 760 Torr (water vapor pressure of about 24 Torr and balance oxygen). Heating was conducted in an about 2.25" diameter furnace using a gas flow rate of about 4.5 standard cubic feet per hour. While keeping substantially the same nominal gas environment, the temperature was increased to about 220°

C. at a rate of about 0.05° C. per minute, followed by heating to about 400° C. at a rate of about 5° C. per minute to form an intermediate layer.

After decomposition, the intermediate layer was heated to about 725° C. at a rate of about 10° C. per minute and held for about three hours in an environment having a nominal total gas pressure of about 760 Torr (water vapor pressure of about 17 Torr, oxygen gas pressure of about 76 milliTorr and balance nitrogen), followed by holding the temperature at about 725° C. for about 10 minutes in an environment having a nominal total gas pressure of about 760 Torr (oxygen gas pressure of about 76 milliTorr and balance nitrogen). The layer was then cooled to about 450° C. in the same nominal gas environment. The layer was held at about 450° C. for about one hour in a gas environment having a nominal total pressure of about 760 Torr (about 760 Torr oxygen), and subsequently cooled to room temperature.

The resulting layer had a critical current density of about $0.85 \times 10^6$ Amperes per square centimeter as determined by transport measurement at 77K in self field using a one microvolt per centimeter criterion.

EXAMPLE III

A buffered substrate was prepared as follows. An about 20 nanometer thick layer of $CeO_2$ was sputter deposited on a YSZ[100] single crystal surface at a rate of about 0.35 Angstroms per second at a temperature of about 725° C.

EXAMPLE IV

A multi-layer article was prepared as follows. A $CeO_2$/YSZ[100] buffered substrate was prepared at the same time and in the same vacuum chamber as described in Example III. A layer of $YBa_2Cu_3O_{7-x}$ was formed on the $CeO_2$ surface using the process parameters described in Example II. The $YBa_2Cu_3O_{7-x}$ layer had a critical current density of about $1.5 \times 10^6$ Amperes per square centimeter as determined by transport measurement at 77K in self field using a one microvolt per centimeter criterion.

EXAMPLE V

Figure 4:
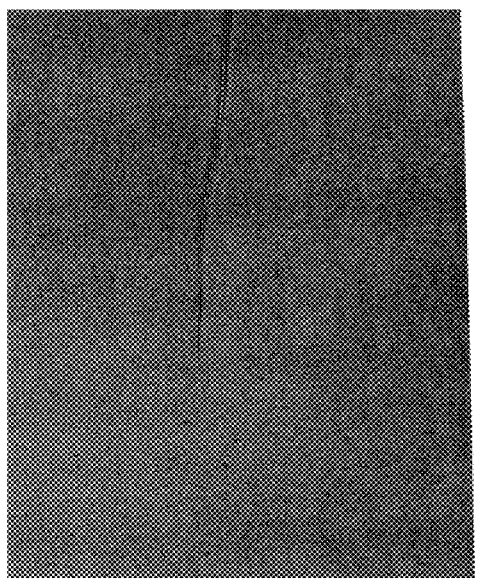
FIG. 4 is a magnified photograph of the sample prepared as described in Example V.

A precursor solution was prepared as described in Example I and spin coated onto the surface of a (100)$SrTiO_3$ single crystal using the protocol described in Example II. The sample was then heated to about 210° C. at a rate of about 10° C. per minute in a gas environment having a nominal total pressure of about 760 Torr (water vapor pressure about 7 Torr and balance oxygen). Heating occurred in an about 2.25" diameter furnace with a gas flow rate of about 4.5 standard cubic feet per hour. Using substantially the same nominal gas environment, the sample was then heated to about 220° C. at a rate of about 0.08° C. per minute, followed by heating to about 400° C. at a rate of about 5° C. per minute. FIG. 4 is a photograph of the resulting sample at 37.5 times magnification.

EXAMPLE VI

Figure 5:
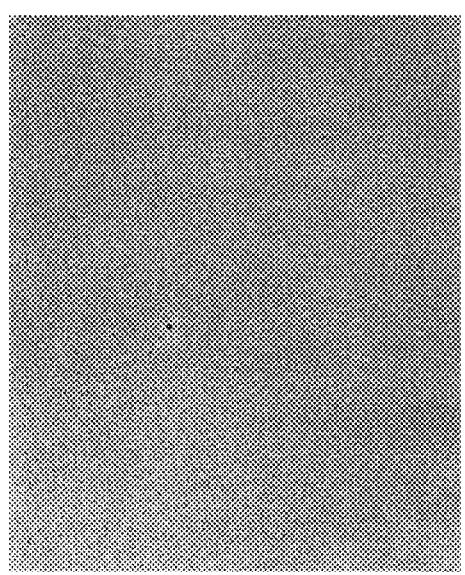
FIG. 5 is a magnified photograph of the sample prepared as described in Example VI.

A sample was prepared as described in Example V except that, during decomposition of the precursor solution, the gas environment was formed of about 12 Torr water vapor and the balance oxygen (nominal total gas pressure of about 760 Torr). FIG. 5 is a photograph of the resulting sample at 37.5 times magnification.

EXAMPLE VII

Figure 6:
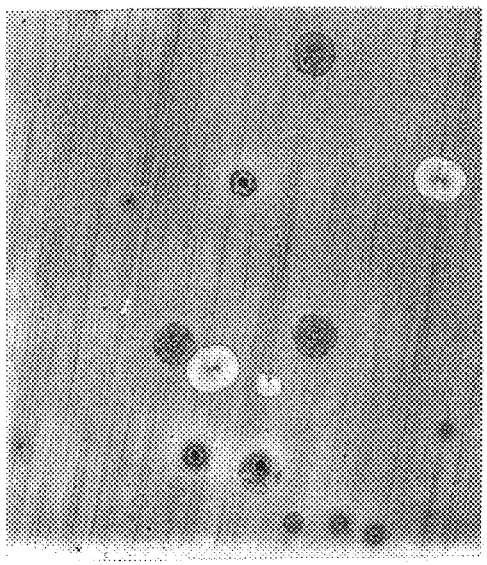
FIG. 6 is a magnified photograph of the sample prepared as described in Example VII.

A sample was prepared as described in Example V except that, during decomposition of the precursor solution, the gas environment was formed of about 40 Torr water vapor and the balance oxygen (nominal total gas pressure of about 760 Torr). FIG. 6 is a photograph of the resulting sample at 37.5 times magnification.

EXAMPLE VIII

Figure 7:
FIG. 7 is a magnified photograph of the sample prepared as described in Example VIII.

A sample was prepared as described in Example V except that a ramp rate of about 0.33° C. per minute was used to increase the sample temperature from about 210° C. to about 220° C. FIG. 7 is a photograph of the resulting sample at 70 times magnification.

EXAMPLE IX

Figure 8:
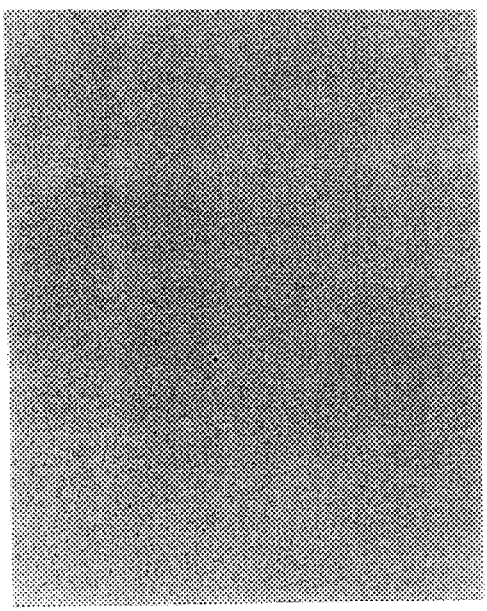
FIG. 8 is a magnified photograph of the sample prepared as described in Example IX.

A sample was prepared as described in Example V except that a ramp rate of about 0.16° C. per minute was used to increase the sample temperature from about 210° C. to about 220° C. FIG. 8 is a photograph of the resulting sample at 150 times magnification.

EXAMPLE X

Figure 9:
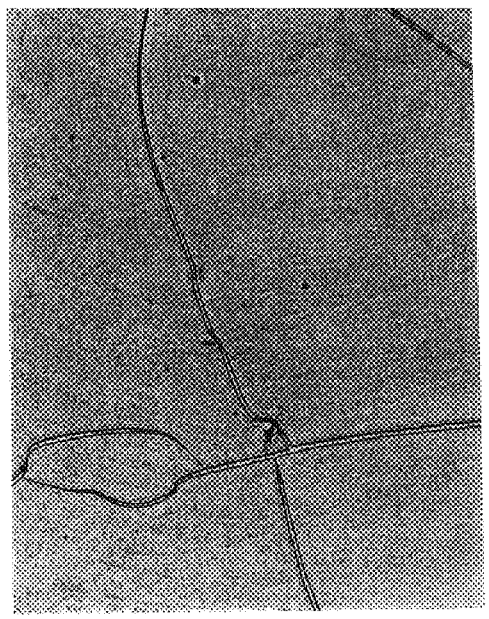
FIG. 9 is a magnified photograph of the sample prepared as described in Example X.

A sample was prepared as described in Example V except that a ramp rate of about 0.05° C. per minute was used to increase the sample temperature from about 210° C. to about 220° C. FIG. 9 is a photograph of the resulting sample at 150 times magnification.

EXAMPLE XI

A multi-layer article was prepared as follows. A sample was prepared as described in Example V except that, during decomposition of the precursor solution, the gas environment was formed of about 24 Torr water vapor and the balance oxygen (nominal total gas pressure of about 760 Torr) and the ramp rate to about 210° C. was about 0.1° C. per minute.

The sample was then heated to about 735° C. at a rate of about 10° C. per minute and held for about three hours in an environment having a nominal total gas pressure of about 760 Torr (water vapor pressure of about 17 Torr, oxygen gas pressure of about 76 milliTorr and balance nitrogen), followed by holding the temperature at about 735° C. for about 10 minutes in an environment having a nominal total gas pressure of about 760 Torr (water vapor pressure of about five milliTorr, oxygen gas pressure of about 76 milliTorr and balance nitrogen). The layer was then cooled to about 450° C. in the same nominal gas environment. The layer was held at about 450° in a gas environment having a nominal total pressure of about 760 Torr (about 760 Torr oxygen), and subsequently cooled to room temperature.

The layer had a critical current density of about $2.5 \times 10^6$ Amperes per square centimeter as determined by transport measurement at 77K an self field using a one microvolt per centimeter criterion.

EXAMPLE XII

A multi-layer article was prepared as follows. The precursor solution prepared in Example I was spin coated onto a buffered substrate formed of $CeO_2$/YSZ/$Y_2O_3$/Ni using the protocol described in Example II. The buffered substrate was prepared using the process parameters described in Example II except that: 1.) the $CeO_2$ layer adjacent the textured nickel substrate was replaced with an about 100 nanometer thick layer of $Y_2O_3$ deposited at a rate of about one Angstrom per second using electron beam evaporation and a temperature of about 700° C.; and 2.) the outer layer of $CeO_2$ was deposited at a rate of about 0.35 Angstroms per second.

The coated sample was decomposed as follows. The sample was heated from room temperature to about 210° C. at a rate of about 10° C. per minute in a nominal gas environment having a total gas pressure of about 760 Torr (water vapor pressure of about 12 Torr and balance oxygen). Heating occurred in an about 2.25" diameter furnace using a gas flow rate of about 4.5 standard cubic feet per hour. While keeping substantially the same nominal gas environment, the temperature was increased to about 220° C. at a rate of about 0.05° C. per minute, followed by heating to about 400° C. at a rate of about 5° C. per minute to form an intermediate. The resulting layer was substantially cracked as determined by visual inspection.

EXAMPLE XIII

A precursor solution was prepared as follows. About 1.36 grams of $Y(CF_3CO_2)_3.4H_2O$, about 2.46 grams of $Ba(CF_3CO_2)_2$ and about 2.51 grams of $Cu(CF_3CO_2)_2.H_2O$ were dissolved in about five milliliters of methanol. About 0.86 milliliters of water was then added and the total volume of the solution was adjusted to about 10 milliliters with methanol.

EXAMPLE XIV

A multi-layer article was prepared as follows. A precursor solution prepared as described in Example XIII was spin coated onto a $CeO_2/YSZ(100)$ single crystal buffered substrate using the protocol described in Example II. The buffered substrate was prepared by sputter depositing an about 20 nanometer layer of $CeO_2$ onto the YSZ(100) at a rate of about 0.35 Angstroms per second at a temperature of about 725° C. Prior to deposition of the precursor solution, the sample was heated to about 950° C. for about one hour in an environment having a nominal total gas pressure of about 760 Torr of a forming gas (about four volume percent hydrogen in argon). The gas environment had a nominal oxygen gas pressure of from about $1\times10^{-12}$ Torr to about $1\times10^{-16}$ Torr.

The coated sample was decomposed as follows. The sample was heated from room temperature to about 210° C. at a rate of about 10° C. per minute in a nominal gas environment having a total gas pressure of about 760 Torr (water vapor pressure of about 24 Torr and balance oxygen). An about 2.25" diameter furnace was used, and the gas flow rate was about 4.5 standard cubic feet per hour. While keeping substantially the same nominal gas environment, the temperature was increased to about 220° C. at a rate of about 0.05° C. per minute, followed by heating to about 400° C. at a rate of about 5° C. per minute to form an intermediate layer. The intermediate layer was then heated to about 765° C. at a rate of about 10° C. per minute in a gas environment having a nominal total pressure of about 760 Torr (about 76 milliTorr oxygen, about 17 Torr water vapor and balance nitrogen). The layer was held under these conditions for about seventy minutes. The layer was then held at about 765° C. for about 10 minutes in a gas environment having a nominal total gas pressure of about 760 Torr (about 0.076 Torr oxygen and balance nitrogen). Using substantially the same nominal gas environment, the layer was cooled to about 450° C. The layer was held at about 450° C. for about one hour in an environment having a nominal total gas pressure of about 760 Torr (about 760 Torr oxygen), and then cooled to room temperature. The $YBa_2Cu_3O_{7-x}$ layer had a critical current density of about $4.3\times10^6$ Amperes per square centimeter as determined by transport measurement at 77K in self field using a one microvolt per centimeter criterion.

EXAMPLE XV

A precursor solution was prepared as follows. About 10.27 grams of $Y(CH_3CO_2)_3.4H_2O$ were dissolved in about 77 grams of water. About 15.52 grams of $Ba(CH_3CO_2)_2$ were dissolved in about 77 grams of water, and about 17.20 grams of $Cu(CH_3CO_2)_2.H_2O$ were dissolved in about 182 grams of water. These three solutions were then mixed together, and about 8.3 grams of pure trifluoroacetic acid were added. The resulting solution was dried under vacuum at about 60° C. until all solvents were removed and only a solid remained. The solid was then dissolved in methanol and diluted with methanol to a total volume of about 100 milliliters to form a precursor solution.

EXAMPLE XVI

A precursor solution was prepared as follows. About 51.4 grams of $Y(CH_3CO_2)_3.4H_2O$ were dissolved in about 514 grams of water. About 77.6 grams of $Ba(CH_3CO_2)_2$ were dissolved in about 388 grams of water, and about 91 grams of $Cu(CH_3CO_2)_2.H_2O$ were dissolved in about 1365 grams of water. These three solutions were then mixed together. About 243 grams of the resulting solution were mixed with about 10 milliliters of pure trifluoroacetic acid. This solution was dried under vacuum at about 60° C. until all solvents were removed and only a solid remained. The solid was then re-dissolved in about 100 milliliters of water and dried under vacuum at about 60° C. until all solvents were removed and only a solid remained. This was repeated a total of seven times. The solid was then dissolved in methanol and diluted with methanol to a total volume of about 50 milliliters to form a precursor solution.

EXAMPLE XVII

A precursor solution was prepared as follows. About 1.36 grams of $Y(CF_3CO_2)_3.4H_2O$, about 2.46 grams of $Ba(CF_3CO_2)_2$ and about 2.51 grams of $Cu(CF_3CO_2)_2.H_2O$ were dissolved in about five milliliters of methanol. About 0.86 milliliters of water was then added and the total volume of the solution was adjusted to about 10 milliliters with methanol.

EXAMPLE XVIII

A precursor solution was prepared as follows. About 1.36 grams of $Y(CF_3CO_2)_3.4H_2O$, about 1.53 grams of $Ba(CH_3CO_2)_2$ and about 2.51 grams of $Cu(CF_3CO_2)_2.H_2O$ were dissolved in about five milliliters of methanol. About 1.14 milliliters of water was then added and the total volume of the solution was adjusted to about 10 milliliters with methanol.

EXAMPLE XIX

A precursor solution was prepared as follows. About 3.50 grams of $Y(CF_3CO_2)_3.4H_2O$, about 6.15 grams of $Ba(CF_3CO_2)_2$ and about 6.40 grams of $Cu(CF_3CO_2)_2.H_2O$ were dissolved in about 25 milliliters of methanol.

EXAMPLE XX

A precursor solution was prepared as follows. About 1.36 grams of $Y(CF_3CO_2)_3.4H_2O$, about 2.46 grams of $Ba(CF_3CO_2)_2$ and about 2.51 grams of $Cu(CF_3CO_2)_2.H_2O$ were dissolved in about five milliliters of methanol. About 2.67 milliliters of water was then added and the total volume of the solution was adjusted to about 10 milliliters with methanol.

EXAMPLE XXI

A precursor solution was prepared as follows. About 1.82 grams of $Y(CF_3CO_2)_3 \cdot 4H_2O$, about 3.28 grams of $Ba(CF_3CO_2)_2$ and about 3.34 grams of $Cu(CF_3CO_2)_2 \cdot H_2O$ were dissolved in about five milliliters of methanol. About 1.14 milliliters of water was then added and the total volume of the solution was adjusted to about 10 milliliters with methanol.

EXAMPLE XXII

A precursor solution was prepared as follows. About 1.50 grams of $Y(CF_3CO_2)_3 \cdot 4H_2O$, about 2.46 grams of $Ba(CF_3CO_2)_2$ and about 2.51 grams of $Cu(CF_3CO_2)_2 \cdot H_2O$ were dissolved in about five milliliters of methanol. About 1.14 milliliters of water was then added and the total volume of the solution was adjusted to about 10 milliliters with methanol.

EXAMPLE XXIII

A precursor solution was prepared as follows. About 1.36 grams of $Y(CF_3CO_2)_3 \cdot 4H_2O$, about 2.46 grams of $Ba(CF_3CO_2)_2$ and about 2.51 grams of $Cu(CF_3CO_2)_2 \cdot H_2O$ were dissolved in about five milliliters of 2-methoxyethanol. About 1.14 milliliters of water was then added and the total volume of the solution was adjusted to about 10 milliliters with 2-methoxythanol.

EXAMPLE XXIV

A $CeO_2/YSZ/CeO_2/Ni$ buffered substrate was prepared as follows. The Ni layer was prepared as described in Example II. The $CeO_2/YSZ/CeO_2$ layers were deposited at Oak Ridge National Laboratory. The $CeO_2/YSZ/CeO_2/Ni$ buffered substrate was thermally conditioned by being held at about 950° C. for about one hour in a gas environment having a nominal total gas pressure of about 760 Torr (17 Torr water and forming gas (about five volume percent hydrogen in argon)). The gas environment had a nominal oxygen gas of from about $1\times10^{-12}$ Torr to about $1\times10^{-16}$ Torr. Using the process parameters of Example II, a precursor solution prepared as described in Example I was spin coated onto the thermally conditioned surface of the $CeO_2/YSZ/CeO_2/Ni$ buffered substrate, and then decomposed to form a substantially defect-free intermediate layer.

The intermediate layer was heated to about 725° C. at a rate of about 10° C. per minute and held for about three hours in an environment having a nominal total gas pressure of about 760 Torr (water vapor pressure of about 17 Torr, oxygen gas pressure of about 76 milliTorr and balance nitrogen), followed by holding the temperature at about 725° C. for about 10 minutes in an environment having a nominal total gas pressure of about 760 Torr (oxygen gas pressure of about 76 milliTorr, about 5 milliTorr water, and balance nitrogen). The layer was then cooled to about 450° C. in the same nominal gas environment. The layer was held at about 450° C. for about one hour in a gas environment having a nominal total pressure of about 760 Torr (about 760 Torr oxygen), and subsequently cooled to room temperature to form a $YBa_2Cu_3O_{7-x}$ layer. The $YBa_2Cu_3O_{7-x}$ layer had a critical current density of about $1.5\times10^6$ Amperes per square centimeter as determined by transport measurement at 77K in self field using a one microvolt per centimeter criterion.

EXAMPLE XXV

A $CeO_2/YSZ/Y_2O_3/Ni$ buffered substrate was prepared as follows. The nickel substrate was prepared as described in Example II. The $Y_2O_3$ layer was about 100 nanometers thick and was deposited at a rate of about 0.1 Angstrom per second at a temperature of about 650° C. using electron beam evaporation. The YSZ layer was about 700 nanometers thick and was deposited at a rate of about 0.1 Angstrom per second at a temperature of about 700° C. using magnetron sputtering. The $CeO^2$ layer was about 19.2 nanometers thick and was deposited at a rate of about 0.6 Angstrom per second at a temperature of about 700° C. using magnetron sputtering.

The $CeO_2/YSZ/Y_2O_3/Ni$ buffered substrate was conditioned as described in Example XXIV.

Using the process parameters of Example II, a precursor solution prepared as described in Example I was spin coated onto the conditioned surface of the $CeO_2/YSZ/Y_2O_3/Ni$ buffered substrate, and then decomposed to form a substantially defect-free intermediate layer.

The intermediate layer was heat treated as described in Example XXIV to form a $YBa_2Cu_3O_{7-x}$ layer. The $YBa_2Cu_3O_{7-x}$ layer had a critical current density of about $1.0\times10^6$ Amperes per square centimeter as determined by transport measurement at 77K in self field using a one microvolt per centimeter criterion.

EXAMPLE XXVI

A multi-layer article was prepared as follows. A buffered substrate was prepared using the process parameters described in Example XXV except that the $Y_2O_3$ layer was replaced with an about 100 nanometer thick layer of $Gd_2O_3$ deposited from a gadolinium alkoxides solution in a forming gas environment.

The $CeO_2/YSZ/Gd_2O_3/Ni$ buffered substrate was thermally conditioned as described in Example XXIV. Using the process parameters of Example II, a precursor solution prepared as described in Example I was spin coated onto the thermally conditioned surface of the $CeO_2/YSZ/Gd_2O_3/Ni$ buffered substrate, and then decomposed to form a substantially defect-free intermediate layer.

The intermediate layer was heat treated as described in Example XXIV to form a $YBa_2Cu_3O_{7-x}$ layer. The $YBa_2Cu_3O_{7-x}$ layer had a critical current density of about $1.5\times10^6$ Amperes per square centimeter as determined by transport measurement at 77K in self field using a one microvolt per centimeter criterion.

While the foregoing discussion has described the invention with respect to certain embodiments of superconductor articles and methods of making such articles, the invention is not limited in this sense. For example, the invention can relate to semiconductor articles and methods of making semiconductor articles or multi-layer articles that are electroceramics which include one or more ferroelectric layers.

Other embodiments are in the claims.

What is claimed is:

1. A method, comprising:

disposing a solution on a surface of a first layer, the solution including a first salt of a first metal, a second salt of a second metal and a third salt of a rare earth metal, at least one of the first, second and third salts being a trifluoroacetate salt; and treating the solution for less than about five hours to form a layer of an intermediate comprising a metal oxyfluoride, the layer of the intermediate having a surface adjacent the surface of the first layer and the layer of the intermediate having a plurality of volume elements, wherein defects contained within the layer of the intermediate comprise less than about 20 percent of any volume element of the layer of the intermediate defined by a projection of one square centimeter of the surface of the layer of the intermediate, and the layer of the intermediate is free of any defect having a maximum dimension of greater than about 200 microns.

2. The method of claim 1, wherein treating the solution takes less than about three hours.

3. The method of claim 2, wherein the first metal comprises copper, and the second metal is selected from the group consisting of barium, strontium and calcium.

4. The method of claim 1, wherein the first metal comprises copper, and the second metal is selected from the group consisting of barium, strontium and calcium.

5. The method of claim 4, wherein the first metal comprises copper, the second metal comprises barium and the third metal comprises yttrium.

6. The method of claim 1, wherein the rare earth metal-second metal-first metaloxide comprises yttrium-barium-copper-oxide.

7. The method of claim 1, wherein defects contained within the layer of the intermediate comprise less than about 10 percent of any volume element of the layer of the intermediate defined by a projection of one square centimeter of the surface of the layer of the intermediate.

8. The method of claim 1, wherein defects contained within the layer of the intermediate comprise less than about five percent of any volume element of the layer of the intermediate defined by a projection of one square centimeter of the surface of the layer of the intermediate.

9. The method of claim 1, wherein the intermediate has a thickness of from about 0.5 micron to about 10 micron.

10. The method of claim 1, wherein the solution further includes water, the solution having a water content of less than about fifty volume percent.

11. The method of claim 1, wherein treating the solution includes heating the solution to a first temperature of from about 190° C. to about 215° C. using a temperature ramp of about 5° C. per minute.

12. The method of claim 11, wherein the solution is heated in an environment having a water vapor pressure of from about 5 Torr to about 50 Torr.

13. The method of claim 11, wherein treating the solution further includes heating from the first temperature to a second temperature of from about 220° C. to about 290° C. using a temperature ramp of from about 0.05° C. per minute to about 0.4° C. per minute.

14. The method of claim 13, wherein the second temperature is about 220° C.

15. The method of claim 13, wherein heating to the second temperature occurs in an environment having a water vapor pressure of from about 5 Torr to about 50 Torr.

16. The method of claim 13, wherein treating the solution further includes heating from the second temperature to about 400° C. using a temperature ramp of at least about 2° C. per minute.

17. The method of claim 16, wherein heating to about 400° C. occurs in an environment having a water vapor pressure of from about 5 Torr to about 50 Torr.

18. The method of claim 16, further comprising heating from about 400° C. to at least about 700° C. to form the layer of the intermediate.

19. The method of claim 18, wherein the layer of the intermediate is biaxially textured.

20. The method of claim 19, wherein the layer of the intermediate comprises a superconductor layer.

21. The method of claim 1, wherein the layer of the intermediate is free of any defect having a maximum dimension of greater than about 100 microns.

22. The method of claim 1, wherein the layer of the intermediate is free of any defect having a maximum dimension of greater than about 50 microns.

23. The method of claim 1, wherein the first layer is selected from the group consisting of a substrate, a buffer layer and a superconductor layer.

24. The method of claim 23, wherein the surface of the first layer is biaxially textured.

25. The method of claim 1, wherein treating the solution includes heating from the first temperature to a second temperature of from about 220° C. to about 290° C. using a temperature ramp of from about 0.05° C. per minute to about 0.4° C. per minute.

26. The method of claim 25, wherein the second temperature is about 220° C.

27. The method of claim 25, wherein heating to the second temperature occurs in an environment having a water vapor pressure of from about 5 Torr to about 50 Torr.

28. The method of claim 1, wherein treating the solution takes less than about one hour.

29. A method, comprising:
disposing a solution on a surface of a first layer, the solution including water, a first salt of a first metal, a second salt of a second metal and a third salt of a rare earth metal, at least one of the first, second and third salts being a trifluoroacetate; and
treating the solution to form an intermediate comprising a metal oxyfluoride,
wherein the solution has a water content of less than about 50 volume percent.

30. The method of claim 29, wherein the water content is less than about 35 volume percent.

31. The method of claim 29, wherein the water content is less than about 25 volume percent.

32. The method of claim 29, wherein the first metal comprises copper, and the second metal is selected from the group consisting of barium, strontium and calcium.

33. The method of claim 29, wherein the first metal comprises copper, the second metal comprises barium and the third metal comprises yttrium.

34. The method of claim 29, wherein the rare earth metal-first metal-second metal-oxide comprises yttrium-barium-copper-oxide.

35. The method of claim 29, wherein the intermediate comprises a layer having a surface adjacent the surface of the first layer and the intermediate includes a plurality of volume elements, defects contained within the layer of the intermediate comprising less than about 10 percent of any volume element of the layer of the intermediate defined by a projection of one square centimeter of the surface of the layer of the intermediate, and the layer of the intermediate being free of any defect having a maximum dimension of greater than about 200 microns.

36. The method of claim 35, wherein defects contained within the layer of the intermediate comprise less than about five percent of any volume element of the layer of the intermediate defined by a projection of one square centimeter of the surface of the layer of the intermediate.

37. The method of claim 35, wherein the layer of the intermediate is free of any defect having a maximum dimension of greater than about 100 microns.

38. The method of claim 35, wherein the layer of the intermediate is free of any defect having a maximum dimension of greater than about 50 microns.

39. The method of claim 29, wherein the intermediate has a thickness of from about 0.5 micron to about 10 micron.

40. The method of claim 29, wherein the solution is heated to a first temperature of from about 190° C. to about 215° C. using a temperature ramp of about 5° C. per minute.

41. The method of claim 40, wherein the solution is heated in an environment having a water vapor pressure of from about 5 Torr to about 50 Torr.

42. The method of claim 40, further comprising heating from the first temperature to a second temperature of from about 220° C. to about 290° C. using a temperature ramp of from about 0.05° C. per minute to about 0.4° C. per minute.

43. The method of claim 42, wherein the second temperature is about 220° C.

44. The method of claim 42, wherein heating to the second temperature occurs in an environment having a water vapor pressure of from about 5 Torr to about 50 Torr.

45. The method of claim 43, further comprising heating from the second temperature to about 400° C. using a temperature ramp of at least about 2° C. per minute.

46. The method of claim 45, wherein heating to about 400° C. occurs in an environment having a water vapor pressure of from about 5 Torr to about 50 Torr.

47. The method of claim 45, further comprising heating from about 400° C. to at least about 700° C. to form the intermediate.

48. The method of claim 47, wherein the intermediate is biaxially textured.

49. The method of claim 47, wherein the intermediate comprises a superconductor.

50. The method of claim 49, wherein the intermediate is biaxially textured.

51. The method of claim 29, wherein the first layer is selected from the group consisting of a substrate, a buffer layer and a superconductor layer.

52. The method of claim 51, wherein the surface of the first layer is biaxially textured.

53. The method of claim 29, further comprising heating from the first temperature to a second temperature of from about 220° C. to about 290° C. using a temperature ramp of from about 0.05° C. per minute to about 0.4° C. per minute.

54. The method of claim 53, wherein the second temperature is about 220° C.

55. The method of claim 53, wherein heating to the second temperature occurs in an environment having a water vapor pressure of from about 5 Torr to about 50 Torr.

56. A method, comprising:
disposing a solution on a surface of a first layer, the solution including a first salt of a first metal, a second salt of a second metal and a third salt of a rare earth metal, at least one of the first, second and third salts being a trifluoroacetate salt; and
treating the solution for less than about five hours to form an intermediate comprising a metal oxyfluoride, the intermediate being capable of undergoing further processing to provide a superconductor material having a critical current density of at least about $5 \times 10^5$ Amperes per square centimeter.

57. The method of claim 56, wherein treating the solution takes less than about three hours.

58. The method of claim 56, wherein the first layer is selected from the group consisting of a substrate, a buffer layer and a superconductor layer.

59. The method of claim 58, wherein the surface of the first layer is biaxially textured.

60. The method of claim 56, wherein the first metal comprises copper, and the second metal is selected from the group consisting of barium, strontium and calcium.

61. The method of claim 60, wherein the first metal comprises copper, the second metal comprises barium and the third metal comprises yttrium.

62. The method of claim 56, wherein the rare earth metal-second metal-first metal-oxide comprises yttrium-barium-copper-oxide.

63. The method of claim 56, wherein the superconductor material has a critical current density of at least about $1 \times 10^6$ Amperes per square centimeter.

64. The method of claim 56, wherein the superconductor material has a critical current density of at least about $1.5 \times 10^6$ Amperes per square centimeter.

65. The method of claim 56, wherein the superconductor material has a critical current density of at least about $2 \times 10^6$ Amperes per square centimeter.

66. The method of claim 56, wherein the intermediate has a thickness of from about 0.5 micron to about 10 micron.

67. The method of claim 56, wherein the solution further includes water, the solution having a water content of less than about fifty volume percent.

68. The method of claim 56, wherein treating the solution includes heating the solution to a first temperature of from about 190° C. to about 215° C. using a temperature ramp of about 5° C. per minute.

69. The method of claim 68, wherein the solution is heated in an environment having a water vapor pressure of from about 5 Torr to about 50 Torr.

70. The method of claim 68, wherein treating the solution further includes heating from the first temperature to a second temperature of from about 220° C. to about 290° C. using a temperature ramp of from about 0.05° C. per minute to about 0.4° C. per minute.

71. The method of claim 70, wherein the second temperature is about 220° C.

72. The method of claim 70, wherein heating to the second temperature occurs in an environment having a water vapor pressure of from about 5 Torr to about 50 Torr.

73. The method of claim 70, wherein treating the solution further includes heating from the second temperature to about 400° C. using a temperature ramp of at least about 2° C. per minute.

74. The method of claim 73, wherein heating to about 400° C. occurs in an environment having a water vapor pressure of from about 5 Torr to about 50 Torr.

75. The method of claim 73, further comprising heating from about 400° C. to at least about 700° C. to form the intermediate.

76. The method of claim 75, wherein the intermediate is biaxially textured.

77. The method of claim 76, Wherein the intermediate comprises a superconductor layer.

78. The method of claim 56, wherein treating the solution takes less than about one hour.

79. The method of claim 56, wherein treating the solution includes heating from the first temperature to a second temperature of from about 220° C. to about 290° C. using a temperature ramp of from about 0.05° C. per minute to about 0.4° C. per minute.

80. The method of claim 79, wherein the second temperature is about 220° C.

81. The method of claim 80, wherein heating to the second temperature occurs in an environment having a water vapor pressure of from about 5 Torr to about 50 Torr.

82. The method of claim 56, wherein the intermediate comprises a layer having a surface adjacent the surface of the first layer and the intermediate includes a plurality of volume elements, defects contained within the layer of the intermediate comprising less than about 20 percent of any volume element of the layer of the intermediate defined by a projection of one square centimeter of the surface of the layer of the intermediate, and the layer of the intermediate being free of any defect having a maximum dimension of greater than about 200 microns.

83. The method of claim 82, wherein the layer of the intermediate is free of any defect having a maximum dimension of greater than about 50 microns.

84. The method of claim 82, wherein the layer of the intermediate is free of any defect having a maximum dimension of greater than about 100 microns.

85. The method of claim 82, wherein defects contained within the layer of the intermediate comprise less than about 10 percent of any volume element of the layer of the intermediate defined by a projection of one square centimeter of the surface of the layer of the intermediate.

86. The method of claim 82, wherein defects contained within the layer of the intermediate comprise less than about five percent of any volume element of the layer of the intermediate defined by a projection of one square centimeter of the surface of the layer of the intermediate.

* * * * *